United States Patent
Da Silveira et al.

(10) Patent No.: US 11,126,096 B2
(45) Date of Patent: Sep. 21, 2021

(54) SYSTEM AND METHOD FOR OPTIMIZING A LITHOGRAPHY EXPOSURE PROCESS

(71) Applicant: Onto Innovation, Inc., Wilmington, MA (US)

(72) Inventors: Elvino Da Silveira, North Andover, MA (US); Keith Frank Best, Tewksbury, MA (US); Wayne Fitzgerald, Le Cheylas (FR); Jian Lu, Chelmsford, MA (US); Xin Song, Andover, MA (US); J. Casey Donaher, Westford, MA (US); Christopher J. McLaughlin, Minneapolis, MN (US)

(73) Assignee: Onto Innovation, Inc., Wilmington, MA (US)

( * ) Notice: Subject to any disclaimer, the term of this patent is extended or adjusted under 35 U.S.C. 154(b) by 0 days.

(21) Appl. No.: 16/650,359

(22) PCT Filed: Sep. 28, 2018

(86) PCT No.: PCT/US2018/053254
§ 371 (c)(1),
(2) Date: Mar. 24, 2020

(87) PCT Pub. No.: WO2019/067809
PCT Pub. Date: Apr. 4, 2019

(65) Prior Publication Data
US 2020/0233320 A1    Jul. 23, 2020

Related U.S. Application Data

(60) Provisional application No. 62/565,940, filed on Sep. 29, 2017.

(51) Int. Cl.
*G03F 7/20*    (2006.01)
*G03F 9/00*    (2006.01)

(52) U.S. Cl.
CPC ........ *G03F 9/7023* (2013.01); *G03F 7/70433* (2013.01); *G03F 7/70516* (2013.01)

(58) Field of Classification Search
CPC ............... G03F 9/97046; G03F 9/7023; G03F 7/70775; G03F 7/70258; G03F 7/70433; G03F 7/70516
(Continued)

(56) References Cited

U.S. PATENT DOCUMENTS 3,434,787 A    3/1969    Chitayat
3,495,512 A    2/1970    Vaughan
(Continued)

FOREIGN PATENT DOCUMENTS

EP    0341848 B1    1/1995
JP    S60-47418 A    3/1985
(Continued)

OTHER PUBLICATIONS

Armitage Jr., J. D. et al., "Analysis of Overlay Distortion Patterns," SPIE Proceedings, vol. 921, Integrated Circuit Metrology, Inspection, and Process Control II, 1988, pp. 207-222.
(Continued)

*Primary Examiner* — Hung Nguyen
(74) *Attorney, Agent, or Firm* — Schwegman Lundberg & Woessner, P.A.

(57) ABSTRACT

A method for correcting misalignments is provided. An alignment for each device of a group of devices mounted on a substrate is determined. An alignment error for the group of devices mounted on the substrate is determined based on the respective alignment for each device. One or more correction factors are calculated based on the alignment error. The alignment error is corrected based on the one or more correction factors.

36 Claims, 11 Drawing Sheets

(58) Field of Classification Search
USPC .................................................... 355/67–71
See application file for complete search history.

(56) References Cited

U.S. PATENT DOCUMENTS

| | | | |
|---|---|---|---|
| 3,498,711 | A | 3/1970 | Ables et al. |
| 3,539,256 | A | 11/1970 | Ables |
| 3,544,213 | A | 12/1970 | Jaeger et al. |
| 3,563,648 | A | 2/1971 | Baggaley et al. |
| 4,473,293 | A | 9/1984 | Phillips |
| 4,488,806 | A | 12/1984 | Takahashi et al. |
| 4,631,416 | A | 12/1986 | Trutna |
| 4,668,089 | A | 5/1987 | Oshida et al. |
| 4,769,680 | A | 9/1988 | Resor, III et al. |
| 5,621,813 | A | 4/1997 | Brown et al. |
| 5,633,755 | A | 5/1997 | Manabe et al. |
| 5,677,758 | A | 10/1997 | McEachern et al. |
| 5,757,160 | A | 5/1998 | Kreuzer |
| 5,828,142 | A | 10/1998 | Simpson |
| 5,933,216 | A | 8/1999 | Dunn |
| 5,969,441 | A | 10/1999 | Loopstra et al. |
| 6,166,392 | A | 12/2000 | Chang et al. |
| 6,171,736 | B1 | 1/2001 | Hirayanagi |
| 6,238,852 | B1 | 5/2001 | Klosner |
| 6,341,007 | B1 | 1/2002 | Nishi et al. |
| 6,525,804 | B1 | 2/2003 | Tanaka |
| 6,624,879 | B2* | 9/2003 | Imai .................... G03F 7/70641 355/53 |
| 6,843,572 | B2 | 1/2005 | Shiraishi |
| 7,385,671 | B2 | 6/2008 | Gardner et al. |
| 8,299,446 | B2* | 10/2012 | Hawryluk ............... H01L 24/03 250/491.1 |
| 9,541,845 | B2* | 1/2017 | Omameuda ......... G03F 7/70775 |
| 10,031,429 | B2* | 7/2018 | Endo ..................... G03F 9/7046 |
| 2003/0218730 | A1 | 11/2003 | Murakami et al. |
| 2004/0026634 | A1 | 2/2004 | Utsumi et al. |
| 2004/0043311 | A1 | 3/2004 | McCullough et al. |
| 2008/0050040 | A1 | 2/2008 | Geers et al. |
| 2008/0106714 | A1 | 5/2008 | Okita |
| 2009/0128832 | A1 | 5/2009 | Van Bilsen et al. |
| 2010/0073663 | A1 | 3/2010 | Meyer |
| 2011/0038704 | A1 | 2/2011 | Hawryluk et al. |
| 2016/0091800 | A1* | 3/2016 | Sasaki ................ G03F 7/70258 355/67 |

FOREIGN PATENT DOCUMENTS

| | | |
|---|---|---|
| JP | S63-261850 A | 10/1988 |
| TW | 200620407 A | 6/2006 |
| TW | 200623232 A | 7/2006 |
| TW | 201142978 A | 12/2011 |
| WO | 2017108453 A1 | 6/2017 |

OTHER PUBLICATIONS

Invitation to Pay Additional Fees mailed Apr. 23, 2019, in connection with International Patent Application No. PCT/US2018/053254, filed Sep. 28, 2018, 14 pgs.

International Search Report and Written Opinion dated Jun. 25, 2019, in connection with International Patent Application No. PCT/US2018/053254, filed Sep. 28, 2018, 22 pgs.

Examination Report dated Nov. 17, 2020, in connection with Taiwan Patent Application No. 107134488, filed Sep. 28, 2018, 7 pgs.

* cited by examiner

500

Determine an alignment error for the devices on the substrate based on a respective alignment for each device
502

↓

Calculate correction factors based on the alignment error
504

↓

Send the correction factors to the placement system for correcting the alignment error
506

SYSTEM AND METHOD FOR OPTIMIZING A LITHOGRAPHY EXPOSURE PROCESS

CROSS-REFERENCE TO RELATED APPLICATIONS

This application is a national stage under 35 U.S.C. § 371 of International Patent Application No. PCT/US2018/053254, filed Sep. 28, 2018, which claims the benefit of U.S. Provisional Application No. 62/565,940, filed Sep. 29, 2017, the disclosures of which are incorporated herein by reference in their entirety.

INTRODUCTION

The present invention relates generally to semiconductor devices and more particularly to a method for fabricating semiconductor devices.

Semiconductor devices are an essential component of modern electronic and computing devices. Semiconductors devices are electronic components that exploit the electrical properties of semiconductor materials. The electrical conductivity of semiconductor materials can be manipulated by the introduction of an electric or magnetic field. Improvements in the manufacturing process have resulted in exponential improvements in the size, speed, and cost of semiconductor devices. However, there continues to be demand for faster, more reliable, and higher performing semiconductor devices.

In a typical semiconductor manufacturing process, bare whole wafers or panels are processed using lithographic techniques to create circuitry thereon. These substrates with circuitry are often then separated into smaller pieces known as die. These die form the basis of common electronic devices. However, during the semiconductor manufacturing process, misalignment in lithographic processes may occur. These misalignment errors may be essentially random, e.g. the result of environmental factors such as temperature or atmospheric pressure change, or may be a result of systematic factors such as consistent positioning errors associated with a the pick and place system.

Misalignment errors in lithographic processes can cause drops in the yield of a process and can also lead to reduced system throughputs. Failure to properly correct for misalignment errors can lead to failed electronic devices where die do not function or where they fail prematurely. Yield, which is defined as the number of good quality die coming out of a process divided by the total number of die that undergo the process, directly affects the revenue that a manufacturer can expect to obtain. Lower yields or yields that reflect lower quality will reduce the amount of revenue one can command for a product.

Correcting misalignment errors tends to negatively affect the throughput of a lithographic manufacturing process. Throughput relates to the rate at which die are produced by a process. Where time consuming misalignment corrections are undertaken on a continued basis, throughputs will drop. The reduction in throughput reduces the quantity of saleable product available. As a result, expected revenues will drop.

It is a goal of the present invention to provide methods and mechanisms for reducing the incidence and magnitude of alignment errors in lithographic semiconductor processing. It is another goal of the present invention to facilitate the correction of existing misalignment in a semiconductor lithographic process in an efficient manner.

BRIEF SUMMARY OF THE INVENTION

A method of making and generally improving the quality of integrated circuit devices is described herein. In accordance with one or more embodiments of the present invention, this method begins with inspecting optically a substrate having a plurality of integrated circuit devices. Devices are identified from the plurality of devices of the substrate that are discrepant, if any. An alignment is determined of each of the plurality of devices relative to the substrate from the results of the optical inspection. The determination of the alignment omits at least some of the devices identified as being discrepant, if any. A recipe is generated for exposing the plurality of devices based at least in part on the inspecting, identifying, and determining steps. Note the term "recipe" is a term of art in the semiconductor industry used to describe the set of instructions and related or supporting information needed to process an integrated circuit device. The recipe includes information on one or more exposure shots, an order for exposing the exposure shots, and a path for moving between at least two of the one or more exposure shots. The recipe is implemented using a lithography system to expose at least a portion of the plurality of devices. The process may be performed repeatedly using the same or different lithographic patterns until a desired structure is satisfactorily formed.

Reducing misalignment amongst integrated circuit devices on a substrate, particularly on reconstituted substrates, and accommodating residual misalignments between the devices is a main goal of the present invention. Advantageously, the determination of alignments of integrated circuit devices relative to their substrate can be obtained as part of a defect inspection process in which images of the integrated circuits are assessed for discrepancies and defects. Careful calibration of the field of view of the imaging device used to conduct the inspection to the mechanical stage on which the substrate is supported provides the localization information needed for alignment purposes.

In one embodiment, a systematic and/or random error present in the position of at least some of the plurality of devices may be determined from the alignment of each of the plurality of devices relative to the substrate. The recipe of a placement system used to position the plurality of devices during the formation of a substrate is modified. The placement system is operated such that subsequent substrates presented for optical inspection have reduced systematic error in the alignment of at least some of the plurality of devices of the subsequent substrates. For example, the systematic error may be corrected by feeding back to devices used to form a substrate the data concerning systematic error. This feedback loop reduces the systematic error in subsequent substrates and improves yield and throughput in the fabrication process.

In one embodiment, the plurality of devices of the substrate may be grouped based on their determined alignment (e.g., to establish a plurality of groups of similarly aligned devices). One or more exposure shots are tiled over each of the respective groups of devices of the substrate. In one example, lithographic patterns that are part of a "shot" are tiled over the respective groups of devices so that the lithographic patterns are well aligned with the devices. The lithographic patterns may have different shapes or arrays. The tiling is characterized by substantially all of the devices exposure by an exposure shot meeting a predetermined alignment criterion. One or more paths are then defined between the one or more exposure shots, thereby establishing the recipe for performing lithographic exposure of the devices.

In one embodiment, substantially all of the devices of a substrate may be exposed by an exposure shot such that alignment between the respective devices and the exposure shots meets a predetermined alignment criterion. The one or more exposure shots tiled over a group may address different numbers of devices and/or may have different shapes.

In one embodiment, a set of initial conditions may be established that includes a set of permissible exposure shots, a grouping of devices on a substrate, and an alignment criterion. The tiling and defining steps are iterated for successive perturbations in the initial conditions. A score is assigned for each iteration of the tiling and defining steps. The score may take into consideration the paths required to move between each of the shots defined by the tilings. For any given tiling, multiple paths may be possible and at least one path will be determined for each tiling. The various combinations of tilings and paths will be scored based on throughput, yield, or some other set of criteria. The recipe is established based on the iteration of the tiling and defining steps having an optimal score. In one embodiment, the successive perturbations in the initial conditions may be modifications selected from a group consisting of a modification in the size of an exposure shot, a modification in an aspect ratio of an exposure shot, a modification of an area of an exposure shot, a modification of a predetermined range of acceptable alignments for defining a group, selection of an initially selected device, selection of a group of initially selected devices, modification of the size of a group of initially selected devices, and modification of the aspect ratio of a group of initially selected devices.

In one embodiment, a set of devices and an exposure shot that nominally would expose all of the selected set of devices may be selected. The exposure shot is fit to a set of the plurality of devices of the substrate. It is determined whether a threshold alignment criterion for alignment of the exposure shot to the selected set of the plurality of devices is met for each of the selected set of devices. The selected exposure shot is established as part of the recipe where the threshold alignment criterion for alignment of the exposure shot to the selected set of the plurality of devices is met for each of the selected set of devices. The selected set of devices is subdivided into one or more subsets where the threshold alignment criterion is not met for a predetermined number of devices of the selected set of devices, the subdivision being made such that a predetermined exposure shot would nominally expose all of the devices in the subset of devices. The fitting, determining, and subdividing steps are repeated until substantially all devices of the substrate are tiled with exposure shots.

In one embodiment, generating a recipe for exposing the plurality of devices includes selecting an exposure shot having a largest area that can be applied to a region of the substrate having a set of devices. The selected exposure shot is fit to the set of devices. A projected yield is computed for the selected exposure shot, the region, and the fitting based on an alignment of the set of devices. It is determined whether the projected yield satisfies an alignment criterion. In response to determining that the projected yield satisfies the alignment criterion, the selected exposure shot is established as part of the recipe. In response to determining that the projected yield does not satisfy the alignment criterion, the selected exposure shot is divided and the steps of selecting, fitting, computing, and determining whether the projected yield satisfies the alignment criterion are repeated until the projected yield satisfies the alignment criterion.

In one embodiment, a recipe for exposing the plurality of devices is generated using dynamic programming techniques. A preexisting exposure shot is selected from a plurality of preexisting exposure shots. Each of the plurality of preexisting exposure shots has a pre-solved field of view size, shape, and orientation. A set of the plurality of devices is compared with the selected preexisting exposure shot. It is determined whether the selected preexisting exposure shot satisfies an alignment criterion for the set of devices. In response to determining that the selected preexisting exposure shot satisfies the alignment criterion for the set of devices, the selected preexisting exposure shot is established as part of the recipe. In response to determining that the selected preexisting exposure shot does not satisfy the alignment criterion for the set of devices, another preexisting exposure shot is selected from the plurality of preexisting exposure shots, and the comparing and the determining whether the selected preexisting exposure shot satisfies the alignment criterion for the set of devices steps are repeated until the alignment criterion is satisfied for the set of devices.

In accordance with another embodiment of the present invention, the alignment of a plurality of integrated circuit devices relative the substrate of which they are part is determined. The devices are grouped based on the determined alignment of the devices to establish a plurality of groups of devices. Each of the plurality of groups are tiled with one or more arrays of lithographic patterns. A path is defined between each of the tiled arrays of lithographic patterns, thereby establishing a recipe for performing lithographic exposure of the devices. The devices of the substrate are lithographically exposed according to the recipe to form at least a portion of a structure on the devices.

In one embodiment, a misalignment of one or more of the plurality of devices may be determined based on the alignment. The misalignment of the plurality of devices of a subsequent substrate that incorporates the devices may be corrected to reduce misalignment amongst the plurality of devices (e.g., by modifying the operation of the tools used to create the present substrate).

In one embodiment, the plurality of groups of devices may be repeatedly tiled to generate a plurality of distinct tilings. A path is defined for each of the distinct tilings. A score for the combination of each of the distinct tiling and its respective path may be generated that is at least partially based upon the number of arrays of lithographic patterns that are required to cover the plurality of devices and the length of time required to travel along the defined path. A distinct tiling is selected that has an optimal score. The selected tiling is used to establish a recipe.

In one embodiment, the groups of devices may be repeatedly tiled to generate a plurality of distinct tilings. A plurality of paths is defined for each of the distinct tilings. A path is selected for each of the distinct tilings based on a length of time required to travel along the defined path. A score is generated for the combination of each of the distinct tilings and its selected path that is at least partially based upon the number of arrays of the lithographic patterns that are required to cover the plurality of devices and the length of time required to travel along the defined path. A distinct tiling and path are selected that has an optimal score. The selected tiling is used to establish a recipe.

In another embodiment of the present invention, a method of improving the quality of integrated circuit devices is provided. An alignment is determined of a plurality of devices relative to a substrate of which they are part. A selected group of the devices is fit to an array of lithographic patterns. It is determined whether an alignment of the array of lithographic patterns to the selected group of devices satisfies a predetermined alignment quality. Where the alignment quality is satisfied (e.g., where a high enough percentage of the devices are properly aligned), the array of lithographic patterns is established as a shot for exposing the selected group of the devices. Where the alignment quality is not satisfied, one or more smaller arrays of lithographic patterns are iteratively fit to a subset of the selected group of the devices until the alignment quality is satisfied and shots for exposing the selected group of devices are established. A path is defined between each of the established shots, thereby establishing a recipe for performing lithographic exposure of the devices. The devices of the substrate are exposed to form at least a portion of a structure on the devices.

As above, the alignment measurements of the integrated circuit devices can be used to determine a misalignment of one or more of the plurality of devices. The misalignment may include alignment errors that arose during the creation of the substrate of which the integrated circuit devices are part. The misalignment of a plurality of devices of a subsequent substrate that incorporates the devices may be corrected (e.g., by modifying the operation of the tools used to create the present substrate) to reduce misalignment amongst the plurality of devices.

In one embodiment, the optimization of the creation of a recipe or set of instructions for lithographically exposing a substrate can be approached by fitting devices to a predetermined shot or by fitting shots to groups defined on the basis of alignment. The end goal is the same in either case, i.e. to obtain good quality alignments between a reticle and the devices in an efficient manner. In another embodiment of the present invention, alignment of a plurality of devices relative to a substrate of which they are part is determined. These devices are then grouped based on the determined alignment of the devices. This establishes a plurality of groups of devices, each device of the group having a similar alignment. Shots or arrays of lithographic patterns of various shapes and sizes are tiled, in the mathematical sense, over the plurality of groups of devices to define the shots for tiling each of the plurality of groups of devices with one or more arrays of lithographic patterns. A path is defined between each of the tiled patterns. The defined shots together with path establish a recipe for performing lithographic exposure of the devices. Once a recipe is in hand, the devices of the substrate are exposed according to the recipe to form at least a portion of a structure on the devices. One benefit of determining the alignment of the devices is that misalignment in the devices on the substrates may be used to correct or reduce subsequent misalignment of devices on a subsequent substrate that is being formed.

In one embodiment, the misalignment of one or more of the plurality of devices may be determined based on the alignment. The misalignment of a plurality of devices of a subsequent substrate that incorporates the devices may be corrected to reduce the misalignment amongst the plurality of devices.

Embodiments of the present invention can be used to form semiconductor devices. Devices of a first group or plurality of devices are mounted on a first substrate with a placement system. The alignment of each device of the first group or plurality of devices is determined and correction factors are determined from a systematic alignment error identified in the placement of the first plurality of devices. The systematic alignment error is based, at least in part, on the respective alignment for each of the first plurality of devices. The correction factors from one or more of the devices are sent to the placement system for correcting the systematic alignment error. The correction factors are then used to mount a second group or plurality of devices on a second substrate. Ideally, the devices of the second substrate will have less systematic alignment error than those of the first substrate.

Alignments of the devices of the second group or plurality of devices on the second substrate are determined and the devices are grouped into one or more groups based on the respective alignment for each device of the second plurality of devices, i.e. devices having similar alignments are grouped together. Fields of view of an exposure system such as a stepper are established based on the groupings of the devices and a motion path for exposing the second plurality of devices is determined. The path is generally based on the one or more groups and the fields of view. The path is scored and is assessed to ensure that the score satisfies a threshold. If the path does not meet the threshold value, the grouping of the second group of devices, the determining of the fields of view, the determining of the path, and the determining of the score are iteratively repeated to form successive groupings, fields of view and paths until the assessed score passes the threshold. Once this criteria is met, the second plurality of devices is exposed using the fields of view and path that satisfied the threshold.

A method, computer program product, and product manufactured by the method for correcting misalignments are provided. An alignment for each device of a group of devices mounted on a substrate is determined. An alignment error for the group of devices mounted on the substrate is determined based on the respective alignment for each device. One or more correction factors are calculated based on the alignment error. The one or more correction factors are sent to a placement system for correcting the alignment error.

A method, computer program product, and product manufactured by the method for determining an optimized exposure path are provided. An alignment for each device of a plurality of devices mounted on a substrate is determined. The plurality of devices is grouped into one or more groups based on the respective alignment for each device. Fields of view or shots for exposing devices in each of the one or more groups are determined. A stepper path for exposing the plurality of devices is determined based on the one or more groups and the fields of view. A score for the determined stepper path is determined and then examined as to whether the score satisfies a threshold. In response to determining that the score does not satisfy the threshold, the steps of grouping of the plurality of devices, the determining fields of view, and/or the determining the stepper path, are iteratively repeated until such time that the threshold is satisfied. Scores are computed for each iteration of these operations.

A method, computer program product, and product manufactured by the method for determining an optimized exposure path are provided. A first plurality of devices is mounted on a first substrate by a placement system. An alignment for each device of the first plurality of devices is determined. An alignment error for the first plurality of devices is determined based on the respective alignment for each of the first plurality of devices. One or more correction factors are calculated based on the alignment error. The one or more correction factors are sent to the placement system for correcting the alignment error. A second plurality of devices is mounted on a second substrate by the placement system using the correction factors. An alignment for each device of the second plurality of devices mounted on the second substrate is determined. The second plurality of devices is grouped into one or more groups based on the respective alignment for each device of the second plurality of devices. Fields of view for exposing devices in each of the one or more groups is determined. A stepper path for exposing the second plurality of devices is determined based on the one or more groups and the fields of view. A score is computed for the determined stepper path, and then examined as to whether the score satisfies a threshold, and in response to determining that the score does not satisfy the threshold, the steps of grouping of the second plurality of devices, the determining the fields of view, the determining the stepper path, and the determining the score are iteratively repeated until such time that the threshold is satisfied. In response to determining that the score satisfies the threshold, exposing the second plurality of devices according to the determined stepper path.

A method, computer program product, and product manufactured by the method for conducting a lithography exposure process are provided. An alignment of a plurality of devices in a reconstituted substrate is determined. The plurality of devices is organized into one or more groups by their alignment, each set corresponding to a field of view addressable by an exposure system. A sequence and a path to address each corresponding field of view to its respective set of devices at an alignment that matches the alignment of substantially all of the devices in the set to within a predetermined misalignment tolerance is defined. Each of the sets of devices is exposed using the defined sequence and path to modify the devices.

These and other advantages of the invention will be apparent to those of ordinary skill in the art by reference to the following detailed description and the accompanying drawings.

DETAILED DESCRIPTION

Figure 1A:
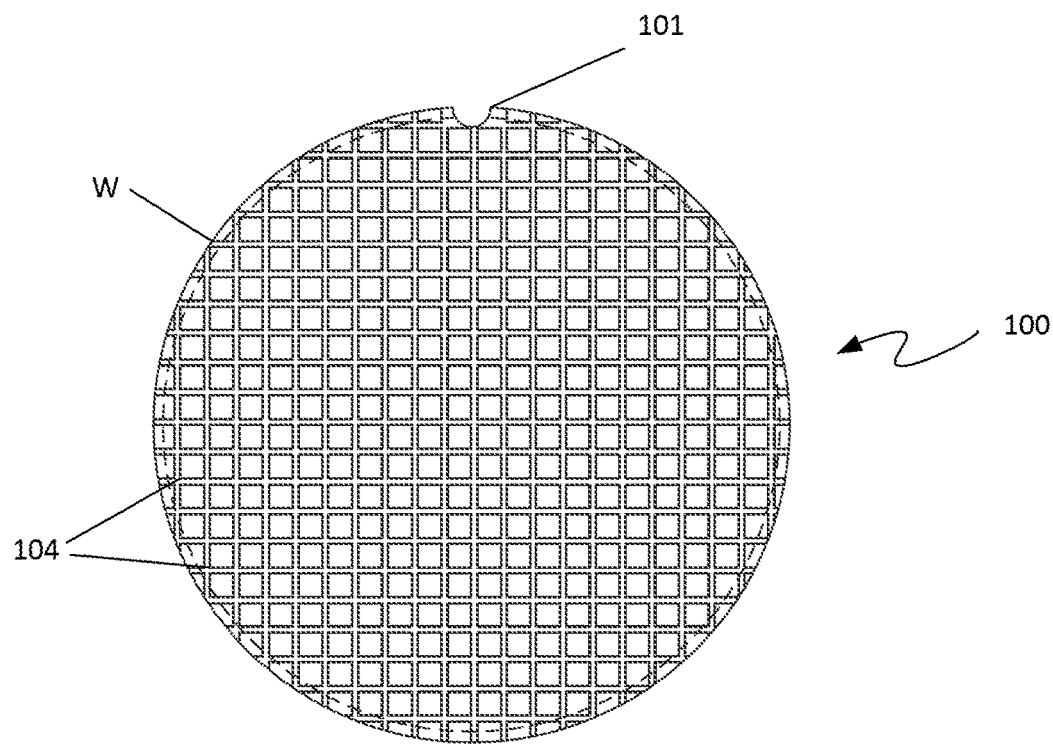
FIG. 1A shows an exemplary semiconductor wafer.

Lithographic processing to create semiconductor or other electronic devices is carried out on many different types of substrates 100. One of the most common is a semiconductor wafer W such as that shown in FIG. 1a. Wafer W is generally a flat discoid object of varying diameter. The wafer W generally includes an orientation structure 101 such as the illustrated notch. Marks, flats and other structures may be substituted for a notch. Wafers W are generally formed of a semiconductor material such as silicon, gallium arsenide, and the like, though in some instances glass or composite materials such as epoxy are used. These wafers W are commonly found in 200 mm or 300 mm diameters, but larger and smaller wafers W are common.

Figure 1B:
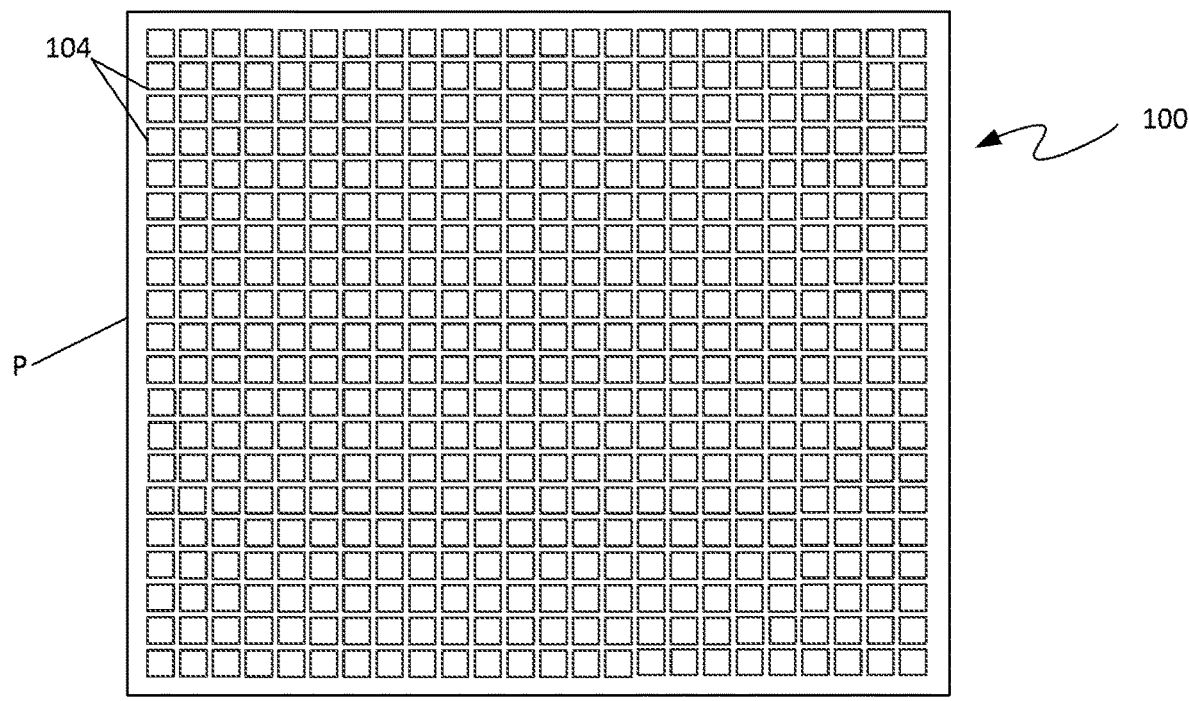
FIG. 1B shows an exemplary semiconductor panel.

FIG. 1b illustrates a generic panel P of a type commonly addressed using lithographic processes. As with wafers W, panels P may be formed of semiconductor materials or of glass or composite materials. Panels P are generally rectangular or square in shape. Panels P may be of any useful size, but are often encountered in "generation" sizes defined in the table below.

| Generation | Size (mm) |
| --- | --- |
| Gen. 1 | 300 × 400 |
| Gen. 2 | 360 × 465 |
| Gen. 2.5 | 400 × 500 |
| Gen. 3 | 550 × 650 |
| Gen. 3.5 | 620 × 750 |
| Gen. 4 | 730 × 920 |
| Gen. 5 | 1100 × 1300 |
| Gen. 6 | 1500 × 1850 |
| Gen. 7 | 1870 × 2200 |
| Gen. 7.5 | 1950 × 2200 |
| Gen. 8 | 2200 × 2500 |

As used herein, the term "substrate" will refer to wafers and panels collectively. Where some specific information specific to either a wafer or a panel, respectively, is to be related, these specific terms will be used.

At various stages of manufacture, a substrate 100 may be bare, not having circuitry formed thereon as yet, or may include devices 104, e.g., integrated circuit devices. Some substrates 100 may have devices 104 formed in their entirety on the same substrate. Other substrates 100 may include multiple devices 104 that are taken from discrete and separate substrates 100 and then connected together using adhesives, molding or potting materials to form a composite or reconstituted substrate 100. As a general rule, reconstituted substrates 100 tend to have much poorer alignment than those substrates 100 on which devices 104 were natively formed.

Figure 2C:
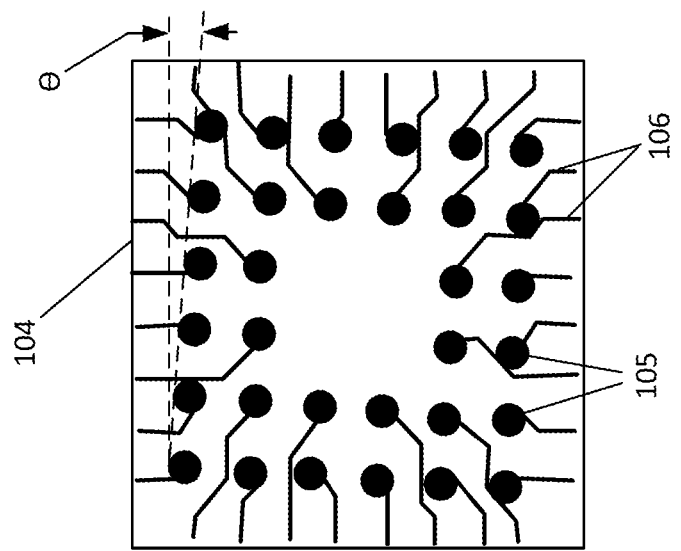
FIGS. 2A-2C show exemplary semiconductor devices having different degrees of alignment.
Figure 2B:
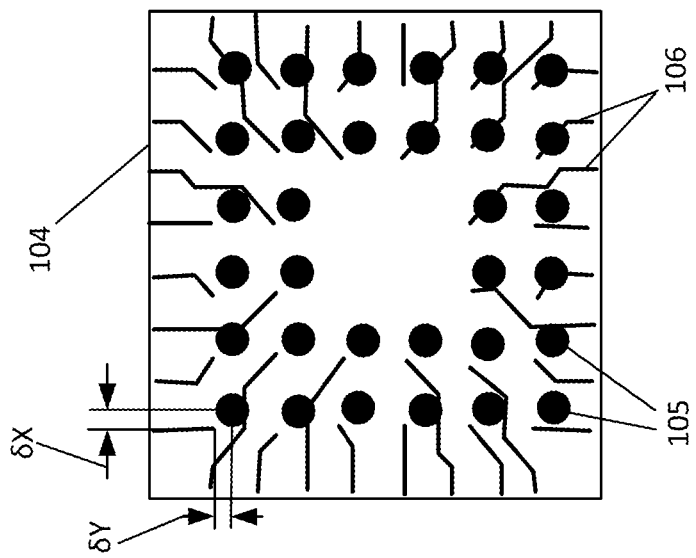
Figure 2A:
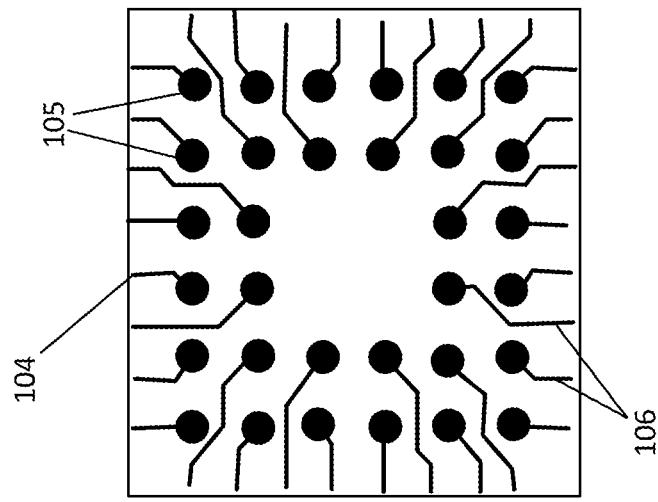

FIGS. 2a-2c illustrate what is meant by misalignment in a device 104. Device 104 in FIG. 2a is representative of a redistribution layer (RDL) that often forms part of a semiconductor device package. Device 104 includes bumps 105 that are connected to traces 106. In FIG. 2a, the respective bumps 105 and traces 106 are in electrical contact with one another. The bumps 105 and traces 106 are formed separately from one another, but because the lithographic patterns used to form these structures are properly aligned to one another on the device 104, the bumps 105 and traces 106 are well formed and of acceptable quality.

FIG. 2b illustrates a scenario in which the bumps 105 of the device 104 are formed by a lithographic pattern that is offset from that of the traces 106 by an amount δX and δY in the X and Y directions. Note that many of the traces 106 do not make electrical contact with the bumps 105. FIG. 2c illustrates a scenario in which the lithographic pattern used to form the bumps 105 is rotated with respect to the lithographic pattern used to form the traces 106 by an angle Θ. Again, there is poor connection between the bumps 105 and the traces 106. For purposes of this disclosure, alignment will be discussed only with respect to translations and rotations in the XY plane of the devices 104 and the substrates 100. Other, higher order, aberrations such as scale, tip, tilt, misalignments out of the XY plane, and the like may also be accommodated using the methods and apparatuses of the present invention, but such accommodations are omitted for the sake of clarity. Aberrations of the type mentioned above are more fully described in J. D. Armitage Jr., J. P. Kirk, "Distortion Components," Proc. SPIE 921, (1988).

Figure 3:
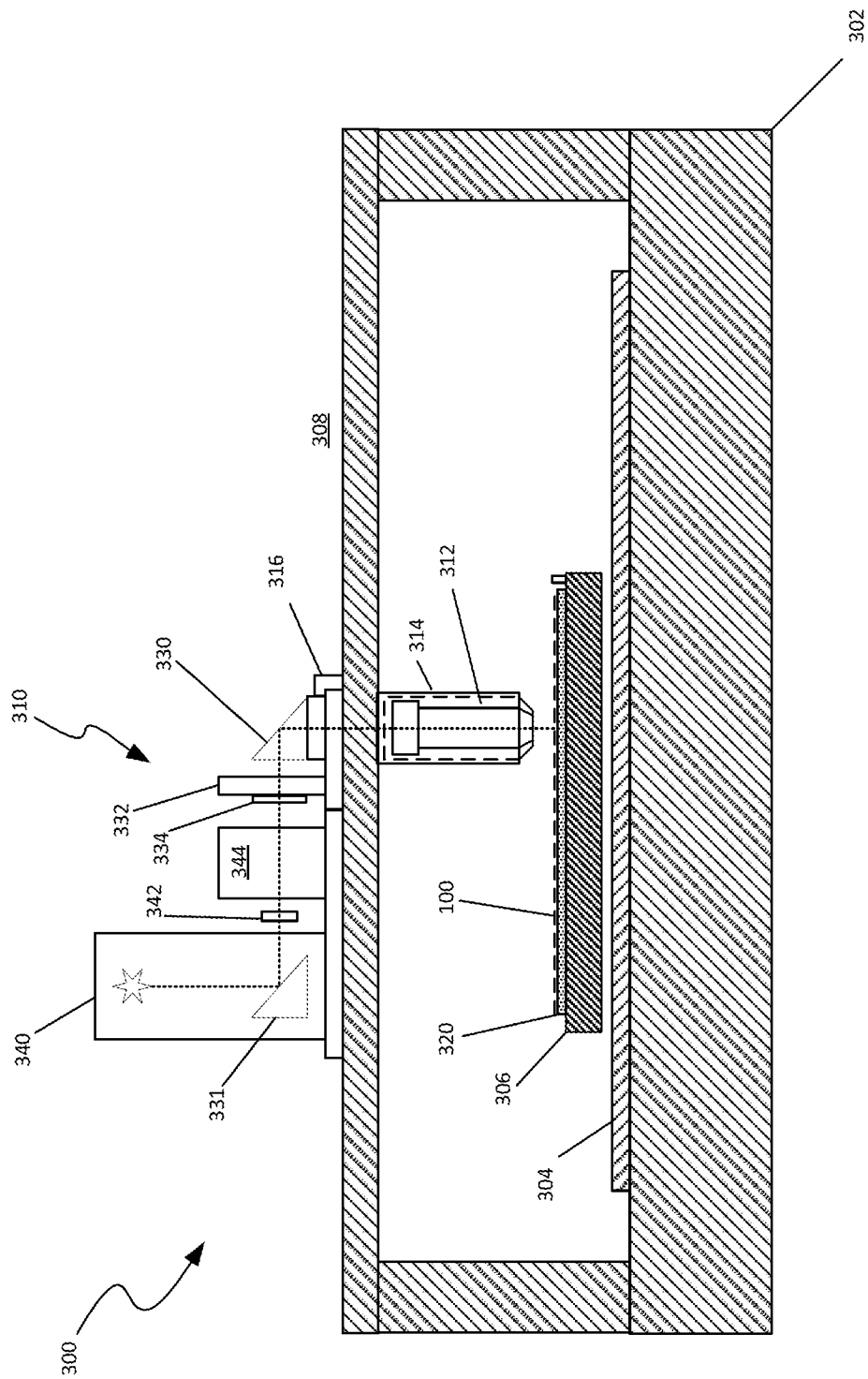
FIG. 3 shows a lithography system known as a stepper.

FIG. 3 is a diagram of a lithography system 300 that may benefit from the application of the present invention. The lithography system 300 includes a base 302, which is typically a large block of finished granite that sits on isolation supports (not shown). The combination of the large mass of the base 302 and the design of the isolation supports provides isolation of the lithography system 300 from floor vibrations. The isolation supports also prevent machine forces from getting into the factory floor and disturbing nearby machinery. The base 302 and isolation supports may be constructed from common commercial parts and materials.

On top of the base 302 is a large grid motor platen 304, such as one disclosed in U.S. Pat. No. 5,828,142, hereby incorporated by reference. The large grid motor platen 304 may include a matrix of soft iron teeth of about 1 mm square, separated in X and Y directions by a gap of about 1 mm. The gaps between all teeth are filled with non-magnetic material, usually epoxy. This surface is ground very flat, to tolerances of a few microns, to provide an air bearing quality surface. Flatness is also useful to control tip and tilt of a main X, Y, Θ stage 306 (hereafter referred to as the main stage 306), a possible source of Abbe offset errors in a stage interferometer system.

The area covered by the grid motor platen 304 is large enough to allow the main stage 306 to move to all required positions. The travel area allows movement to a substrate exchange position (at the system front) and throughout an exposure area. The travel area for the embodiment described herein correlates to the size of a substrate carried on the stage 306.

The stage 306 has within its body a number of forcer motors (not shown). These motors are arranged to drive the stage across the grid motor platen 304. Two motors are oriented to drive the main stage 306 in an X-axis direction. Two additional motors are oriented at 90° to drive the main stage 306 in a Y-axis direction. Either or both pairs of motors may be driven differentially to provide small rotation motion (e). In this manner, the main stage 306 may be controlled to move in a very straight line even though the tooth pattern in the grid motor platen 306 may not be straight.

In FIG. 3 the stage 306 is shown as having a chuck 320 mounted thereon. The illustrated chuck 320 has a form factor adapted to support a substrate 100 that is a panel P. As described in U.S. Pat. No. 7,385,671, the chuck 320 may have substituted therefore different numbers or types of chucks or top plates adapted to hold different substrates 100 such as silicon wafers W. U.S. Pat. No. 7,385,671 is hereby incorporated by reference.

A stiff bridge structure 308 supports a projection camera 310 above the main stage 106. The projection camera 310 has a projection lens 312, of approximately 2× (i.e., two times) reduction, mounted in a lens housing 314. The lens housing 314 is mounted on two Z-axis (vertical) air bearings, not shown. These air bearings may be commercially purchased and are preferably a box journal style, which are very stiff. This Z-axis motion is used to move the lens housing 314 and projection lens 312 up and down over small distances needed for focus. The projection lens 312 is preferably telecentric at its image side, so that small changes in focus do not cause image size or image placement errors.

Note that other optical arrangements and magnifications are contemplated and the optical arranged described herein is not to be taken as limiting.

The projection lens housing 314 has an individual, real-time, auto-focus sensor (not shown) attached to its bottom. These sensors use simple optics to transform a laser diode light source into a focused slit of light at a substrate 100. Some of the light from this slit reflects off the substrate 100 and is captured by a receiving side of the real-time auto-focus sensor. The reflected slit light is imaged by the receiving optics onto a linear CCD array (not shown). Image processing software is used to locate the image of the reflected slit on the CCD array. Any shift in the position of the image of the reflected slit is then used to control Z-axis drive 316 for projection camera 310, until the position of the image on the CCD array is restored. In this manner, the "focus" of projection camera 310 is maintained at a constant gap. During the construction of a lithography system, the motion of the Z-axis in micrometers is used to determine the motion of the image on the CCD array in pixel units. This calibration permits conversion of subsequent focus offsets to be implemented as pixel offsets in the Z-axis focus control system.

Attached to the top of the lens housing 314 is a fold mirror 330. This mirror 330 puts the remainder of the projection camera 110 off to the left side in the Figure. In this embodiment, the projection lens 312 is designed to have a long working distance at its object side to permit use of the fold mirror 330. Note that by the omission of fold mirrors from the projection camera 310, a straight optical path may be achieved. Fold mirrors having different orientations may also be used to further form the optical path of the projection camera 310 to meet whatever space requirements that exist.

Projection camera 310 has its own 6-axis reticle chuck 332, which holds a reticle 334 that includes the (lithographic) pattern or mask being imaged onto the respective devices 104 of the substrate 100. The reticle 334 may be referred to as an image source. It should be understood that other devices may also be used as image sources, such as a multi-mirror light valve or an LCD light valve that dynamically generates a mask (i.e, a maskless image source).

Illumination for the lithography exposure is provided by a lamp house 340 that encloses a mercury lamp that in one embodiment outputs about 3500 watts power. The light within the lamp house 340 is collected, focused, and filtered, and then exits the lamp house 340 near a shutter 342. Note that as shown, the lamp house 340 includes a fold mirror 331 that allows the optical path of the projection camera 310 to be made more compact. The folded arrangement of the projection camera 310 illustrated in FIG. 3 is only one configuration of many that can be or are commonly used.

When the shutter 342 is opened, light from the lamp house 340 passes through a condenser lens assembly 344, through the reticle 334, through projection lens 312, and exposes the substrate 100 with the image imposed by the reticle 334. As is well understood, the substrate 100 is coated with a photo-sensitive resistive coating. A dose sensor (not shown) may be part of the shutter 342. Where the pattern projected by camera 310 is well aligned with the devices 104, one obtains a good quality product such as that shown in FIG. 2a.

The foregoing description is of a stepper type configuration for a lithography system. Other configurations such as scanners and imprint lithography systems are well known and may benefit from the application of the present invention.

Figure 4:
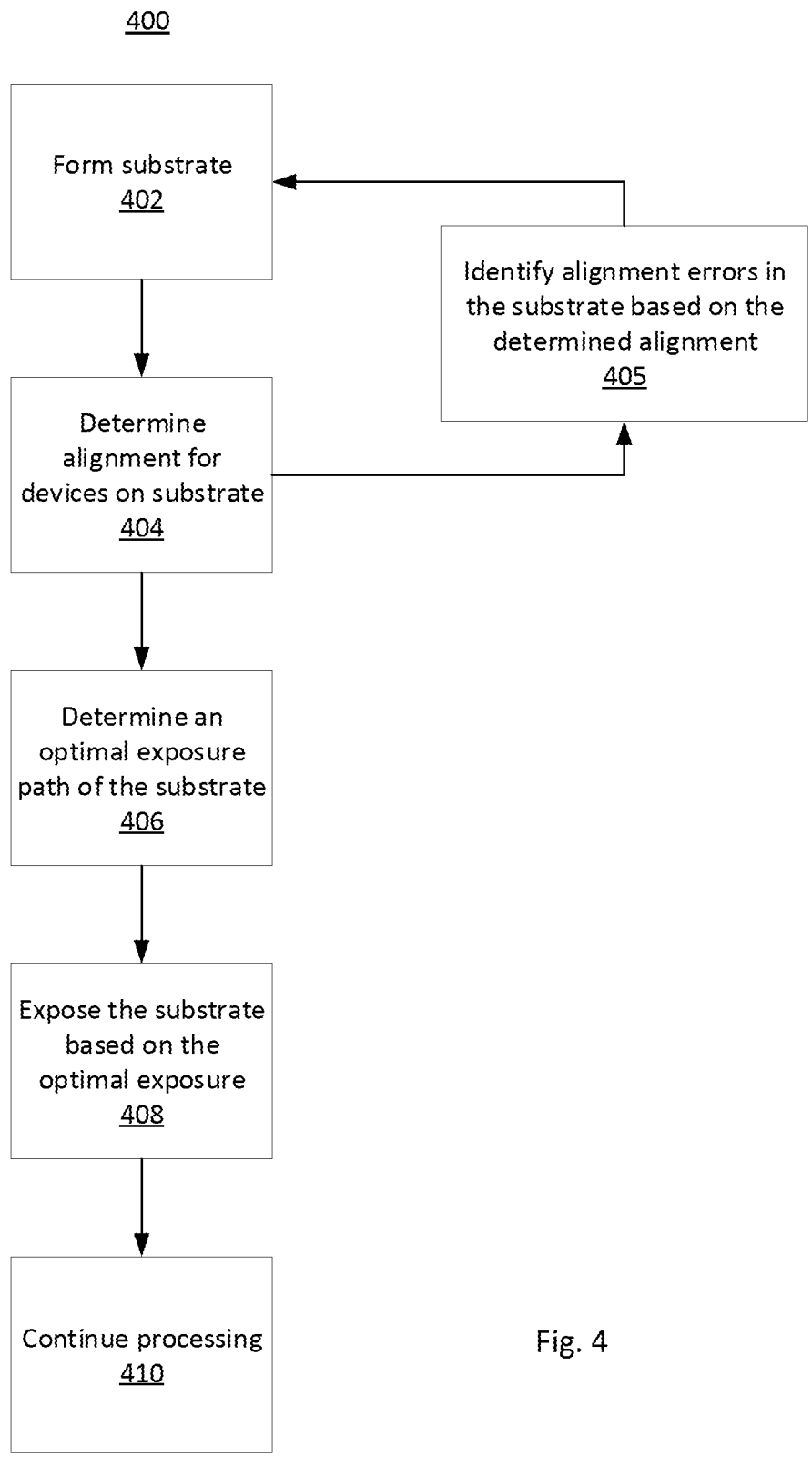
FIG. 4 shows an exemplary method of optimizing lithographic exposure of a substrate.

FIG. 4 shows a method 400 for optimizing exposure of a substrate 100 during lithography in accordance with one or more embodiments. Method 400 may also be applied to correct and/or account for the misalignments on the wafer during the semiconductor manufacturing process.

At step 402, a substrate 100 (either a wafer W or panel P) is formed. The substrate 100 may include devices 104 or other circuitry or structures commonly formed using lithographic processes. The substrate 100 may be formed with the devices 104 in situ or may be a reconstituted substrate 100 in which multiple devices 104 are individually placed in an array using a pick and place or similar system and then molded or potted to form a reconstituted substrate 100.

At step 404, an alignment is determined for devices 104 on the substrate 100. The alignment may be determined using an inspection system. Any suitable inspection system may be used. One example of a suitable inspection system is the Firefly® semiconductor inspection system from Rudolph Technologies, Inc. of Wilmington, Mass. An inspection system facilitates the identification of misalignment and the computation of proper alignment for each device or group of devices on the substrate 100.

Note that method 500 may optionally be called at connector 500. Method 500 will be described in more detail below. At step 405, alignment errors (and other defects) of devices 104 of the substrate 100 are used to determine correction factors that may be applied to the placement system to remediate subsequent misalignment derived from the placement system. The correction factors are, from a practical point of view, used to generate offsets that modify the operation of the placement system and specifically the motion of a pick and place head of the placement system. The offsets reduce systematic error in the formation of the substrate 100. For example, the systematic alignment errors may be a consistent bias in the placement of each device 104 in a reconstituted substrate 100. The correction factors may include specific distances or angles that are added or subtracted from the motion of a pick and place head of a placement system. For example, a pick and place head may be instructed to move to a nominal X, Y location that is in reality incorrect due to errors detected during the alignment step 404. Offsets generated from correction factors that are an output of step 500 modify the nominal X, Y position to which the pick and place head is intended to move. The correction factors may also be a set of distances or angles that are applied to an alignment of a substrate 100 that is addressed by a placement system, that is, where a global alignment of a substrate within a placement system is in error, that alignment may be corrected by applying correction factors to offset the X, Y, Θ alignment of the substrate, thereby reducing or eliminating systematic error. These correction factors may be fixed as where the systematic error is consistent over time, or may be transient based on one or more environmental characteristics such as temperatures or pressures. Additive or cumulative errors may also be corrected in this manner. Alignment errors may be identified based on the alignment identified at step 500.

Alignment errors are identified relative to the substrate 100 of which the devices 104 are a part and/or relative to other devices 104, i.e. in some instances the alignment of devices 104 are determined relative to the substrate 100 and in other instances, alignments between selected devices 104 are obtained. Alignment data is captured and recorded in a data file associated with each substrate 100 and/or device 104 for future use and reference. Examples of such data files are comma separated value (CSV) or an extensible markup language (XML) file. Other file types may be used as well.

Based on the identified alignment errors, correction factors are calculated and fed back to the mechanisms and processes used to carry out step 402. For example, systematic alignment errors imposed on a reconstituted substrate 100 by a pick and place system may be corrected by modifying the operation of the pick and place system to reduce alignment error in subsequent substrates 100. Step 405 will be discussed in further detail below with respect to FIG. 5.

At step 406 an optimal recipe that includes an exposure path of the substrate 100 is determined. The alignment of each device 104 (determined at step 404) is used to find an optimal exposure recipe that will maximize value. In one embodiment, the inputs to this optimization include the determined alignment as well as throughput and yield goals, though ultimately, the goal of the optimization process is to maximize value. As those skilled in the art are aware, alignment can be correlated directly with yield. Where the layers of a semiconductor device align well with one another, the likelihood that the device will function as designed is high. This correlation is sometimes used as short hand to specify the tolerance for alignment, that is, by specifying a high yield output for a lithography process, one is requiring a very high accuracy for alignment. As alignment of a mask/reticle to a device 104 has a time cost associated with it, tighter alignment requirements will slow the processing of substrates 100. At one end of the spectrum, perfect yield reduces throughput because too many alignments or inefficient paths takes up process time. At the other end of the spectrum, yield suffers where too few or too coarse alignments are used.

One benefit to the present invention is that the same alignment information obtained at step 404 may be used to generate alignments for lithography exposure and for the generation of correction factors that can be used to remove systematic error in the placement of devices 104 in substrate 100. This eliminates the need for multiple inspection and alignment processes and saves time, thereby increasing the throughput of the manufacturing process.

An optimal exposure recipe will group devices by alignment and will break these groups up into chunks that are readily addressed by an existing set of available shot sizes and shapes. Available shot sizes and shapes are defined by the masks or patterns found on a reticle 334 in reticle chuck 332, by the masks or patterns on additional reticles 334 that may be substituted for a reticle in the chuck 332 and by the use of masking devices that can modify the patterns on a reticle on the fly. The number and order of the shots and the travel paths between the shots are selected to minimize reductions in throughput. In some cases, it may be better to use well-known boustrophedon paths and change the shot size and shape. In other cases, it may be better to use a complex path in which multiple shots of the same size and shape are exposed before shifting to another size and shape shot. Over time, alignment errors identified at step 404 and fed back to step 402 will reduce misalignment, which will reduce the complexity of the alignment/exposure process, thereby facilitating the determination of the optimal path at step 406 and increasing value.

Figure 6:
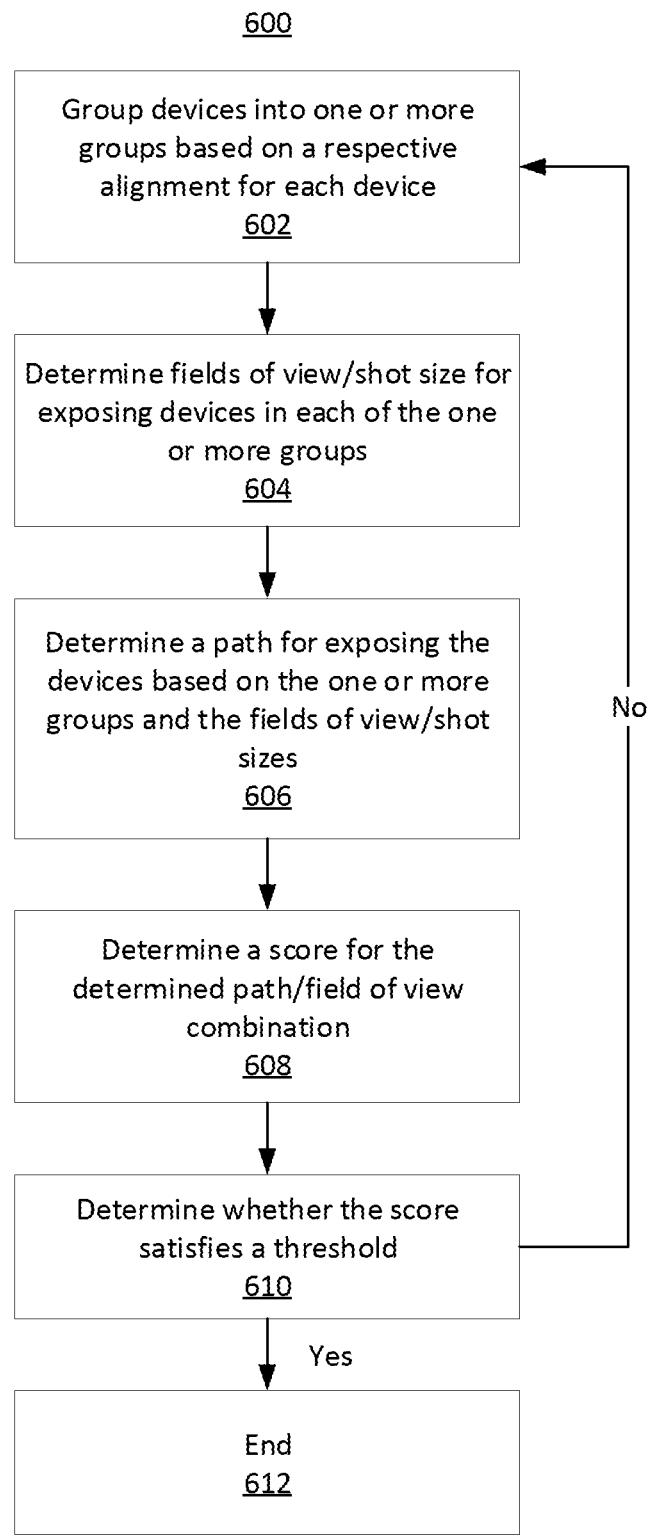
FIG. 6 shows a method for determining an optimal exposure of a wafer.

Step 406 will be discussed in further detail below with respect to FIG. 6.

At step 408, the substrate 100 is exposed based on the determined optimal exposure recipe using a suitable lithography system such as stepper system 300. Processing of substrates 100 continues at step 410 until all substrates have been completed.

Figures 5, 12:
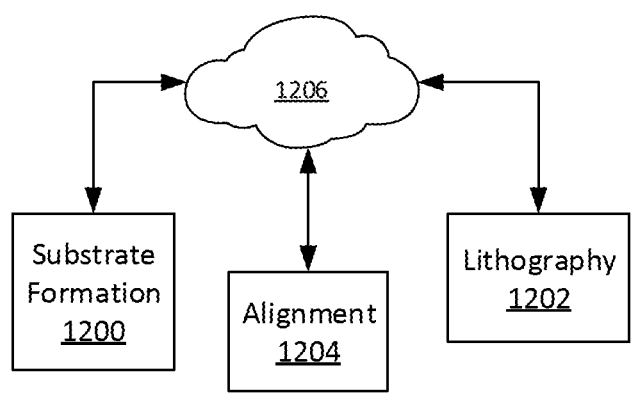
FIG. 5 shows a method for correcting misalignment of devices on a substrate.
FIG. 12 illustrates a cloud communication arrangement for carrying out the present invention.

FIG. 5 shows a method 500 for correcting misalignment of devices on a substrate 100 such as a reconstituted wafer or panel in accordance with one or more embodiments. Method 500 may be implemented as at step 405 of FIG. 4.

At step 502, respective alignment errors for devices 104 on the substrate 100 are determined based on an alignment of each device. The alignment of each device may be determined using an inspection system at step 404 of FIG. 4. In one embodiment, the measured alignment of each device is compared with a target alignment of the device, and a respective alignment error or offset is then calculated for each device based on the comparison.

Alignment of an entire substrate 100 on a global level is generally determined by capturing images of sufficiently widely spaced fiducial marks formed on the substrate. As described above this may be done using an optical inspection system such as a Firefly® semiconductor inspection system. The location of the fiducial marks is specified in the coordinate system of the chuck or stage to which the substrate 100 is temporarily fixed. Comparison of the XY locations of the fiducials with the nominal or specified positions of these marks is used to generate correction factors such as simple XY offsets for aligning the substrate 100. Angular correction factors (e.g. Θ offsets) can be determined by comparing the angle of a line drawn between the fiducials to a nominal specified axis of alignment. These correction factors are similar to and in some instances may be the same as those described in conjunction with FIGS. 4 and 5. The stage or chuck on which the substrate 100 is supported can be moved and/or rotated to achieve the proper alignment relative to a selected coordinate system once the correction factors have been applied to bring the coordinate system of the substrate 100 into alignment with the coordinate system of the lithography system.

As used herein, the term 'alignment' describes both the process of and the data concerning the physical orientation of a device 104 or substrate 100. And because physical orientation must be measured relative to something, alignment also suggests the existence of a frame of reference or coordinate system within which the device 104 or substrate 100 can be localized. These frames of reference or coordinate systems may use one or more devices 104, individually or taken together as a group, to establish a coordinate system. Similarly, the substrate 100 itself may define the frame of reference. It is also to be understood that various tools or systems that interact with substrates 100, such as a placement system, inspection system or lithography system, may also define a coordinate system. The data files (e.g. CSV, XML, . . . ) mentioned hereinabove capture information about the position of a substrate 100 and its devices 104. This data can then be used to create one or more transforms, i.e. mathematical relationships between the orientation of a substrate 100 and/or its devices 104 and the orientation of a system and/or its components that will act upon the substrate 100. An example of this is the use of a Firefly® inspection system to determine an alignment of devices 104 present on a substrate 100 relative to the coordinate system defined by fiducials present on the substrate 100. A subsequent process step involving a lithography system would then require only that the lithography system determine an alignment of a substrate 100 relative to the coordinate system of the lithography system. The recorded alignment data would then facilitate direct knowledge, by means of a transform, of the alignment of devices 104 relative to the lithography system. Transforms such as those described may be determined in situ by means of alignment mechanisms such as those described herein below. These transforms may also be determined a priori by means of calibration of the respective mechanisms/systems, i.e. the positions of devices 104 relative to a lithography system and its components, such as a reticle, may be determined in advance of actually placing the substrate 100 in the lithography system.

Alignment of individual devices 104 is optically carried out as described above by capturing images of the individual devices 104, identifying fiducials (which often are simply distinctive features in known positions on the device 104), and identifying their XY positions and Θ orientation with respect to a coordinate system of the substrate 100 itself. Alignment of both substrates 100 and the devices 104 that are contained therein may be conducted using images, as described above, but may also be conducted using non-imaging techniques such as laser triangulation, confocal sensing, interferometry, or the like. In such non-imaging techniques, a non-imaging sensor will be able to localize some aspect of a device such as the aforementioned fiducials and or features. As will be appreciated, this alignment step produces alignment information or transforms for each device 104 relative to the substrate 100 of which they are a part. This data is maintained in a database or in file that is retained and which can be queried whenever the substrate 100 is to be acted upon in some way. The upshot is that with this saved alignment data, one can, with a simple alignment of the substrate 100 to the coordinate system of an inspection or processing system such as a lithography stepper 300, immediately have access to alignment data that allows immediate alignment of the system 300 to the devices 104 without measuring their alignment once again on the lithography stepper 300.

The database or data files that retain the aforementioned alignment data are commonly maintained in a readily portable and modifiable such as the XML format. These data files are further capable of maintaining alignment data for multiple layers of the device 104 structures. This multilayer data can be used to assist in the determination of an optimal recipe or approach to processing a substrate 100. For example, while the underlying alignment of a device 104 relative to its substrate may not change over time, it is possible that a process step may form a layer of the device 104 in a misaligned fashion. So long as the misalignment does not itself render the device 104 inoperable, subsequent processing (more layers) may be performed. But because there is a misalignment in the uppermost layer of the device 104, proper alignment to the device is not necessarily the same is it would have been were the previous layer properly aligned. Subsequent process steps would be required to accommodate the misalignment of the previous layer. As will be appreciated, the use of a Firefly® or other inspection or alignment system makes it relatively easy to identify and record misalignments by layer.

One use of the aforementioned data files is the identification of systematic error in the positioning of devices 104 in a substrate 100. While this type of error is most often found in more variable reconstituted substrates, wafers and panels formed from scratch, as it were, may also have systematic error of various types. Systematic alignment errors are alignment errors that are consistently and predictably present in each substrate or device. Such systematic alignment errors may be a result of a placement system (e.g., pick and place system) or the molding process that form a reconstituted substrate. The alignment error is determined based on the respective alignment error for each device relative to the substrate and/or to other devices. In one embodiment, an average alignment of the devices 104 on the substrate 100 is used as a baseline alignment from which alignment errors are measured. In another embodiment, alignment errors are measured from a nominal alignment that is based on a coordinate system defined by the substrate 100 itself. In both cases, the absolute position of the devices 104 relative to the substrate 100 and any fiducial or other alignment marks of the substrate 100 are determined and retained.

At step 504, correction factors are calculated based on determined alignment errors. As indicated above, for the purposes of this invention alignment errors are measured X, Y, and Θ offsets. Systematic and random error is identified and measured as between multiple substrates 100. While it is to be understood that alignment differences or 'errors' can be characterized within a single substrate, the processes of manufacturing devices 104 are subject to error that extends across multiple substrates 100. Identifying and quantifying error in alignment of devices 104 can be as simple as performing a simple mathematical comparison between respective devices 104 and their ideal counterparts. More involved processes can be used to quantify such alignment error and to determine whether such error is systematic or random. Note that the terms 'alignment error' and 'correction factors' are related in that both sets of information are useful in identifying positional deviation of devices 104 and substrates 100 and in ensuring that processing systems 300 can be readily aligned to the variably aligned devices 104. A correction factor may have the additional connotation of being alignment information that is used to correct the operation of a mechanism such as a pick and place system that is introducing systematic alignment error.

At step 506, the correction factors are sent (or fed back) to the placement system for correcting systematic alignment error. The placement system can thus mount another set of devices 104 on subsequent substrates 100 based on the correction factors in such a way that the alignment error is corrected or minimized in the other set of devices. The goal of feeding correction factors backwards to a placement is to damp out error in the alignment of devices 104 so that subsequent iterations of the process described herein are more efficient and accordingly, produce more value.

Before discussing methods whereby a process such as lithography can be optimized, it is important to discuss in a bit more detail the types of criteria or figures of merit that are preferred for optimization. The scoring used to determine an appropriate path and exposure recipe may take any useful form. In one embodiment, a figure of merit is computed based on process criteria and data. This figure of merit may be a cost, in which case it is to be minimized. In other cases the figure of merit may be a profit, in which case it is to be maximized. Other scenarios in which an optimization that falls between the foregoing cases may also be contemplated. In some instances, heuristics may be used in lieu of a more mechanistic figure of merit approach to institute a desirable path and exposure recipe.

One or more criteria may be applied to measure the success or quality of the alignment and, overall, the lithography process. Further, some assessments of alignment and lithography quality may be time shifted, i.e., the assessment may be undertaken after lithography has been completed as a 'look back' at the success of the lithography process as a function of inputs to the system, such as alignment quality, throughput, and the results of optical and electrical testing of the resulting functional semiconductor devices. Criteria such as alignment may be assessed on a one to one basis with a pattern that is to be projected by a reticle or on a many to many basis as where alignment is determined as between a set of devices and the corresponding reticle patterns that are used to expose the devices. The limits, ranges, or thresholds used to establish whether a lithography process is acceptable may be established before the process is undertaken on the basis of a desired outcome. Alternatively, these limits, ranges, or thresholds may be established on the basis of past data that has been analyzed to identify suitable values. By way of example, in some embodiments, acceptable alignment criteria may be established as between 0% and 5% variation from congruence. This range may be high or low depending on the application, and as those skilled in the art will appreciate, by modifying this range, one may modify the yield and throughput of the lithography process.

Determining an optimal recipe for the processing of a substrate 100 is a non-trivial problem. At a very high level, the process involves identifying a suitable arrangement of shots or fields of view to cover the devices 104 on a substrate 100 in a way that meets established alignment and throughput criteria. FIG. 6 illustrates one high level approach 600 to identifying a suitable recipe for lithographic exposure of a substrate 100.

Alignments of devices 104 having previously been determined at step 404, the devices 104 on a substrate 100 are grouped by their respective alignments as indicated at step 602. Next, at step 604, each group of devices 104 has a number of shots mapped or tiled thereover. All or substantially all of the devices 104 are so covered. A path is determined to ensure that each shot of each of the groups is presented to the projection camera 310 for exposure as at step 606. Because it is desirable to ensure that this process proceeds in an efficient manner, scores are determined for the mapping and path finding steps as at step 608. These scores are then assessed at step 610 to determine whether they meet a predetermined threshold value. Steps 602-608 may be repeated where the threshold value is not met or where one desires to minimize or maximize the scores. Advantageously, this process may be performed offline without tying up a lithography system 300.

Turning again to step 602, the process of arranging shots to devices 104 involves grouping devices into one or more similarly aligned groups. In one embodiment, this is done using blob analysis or clustering techniques in which devices 104 near to an initially selected device 104 are assessed to determine whether the alignment of these adjacent devices are within a predetermined range of acceptable alignments. After all adjacent devices 104 are categorized as being part of a group that includes the initially selected device 104, a subsequent, ungrouped device 104 is selected and the analysis is again employed to identify whether adjacent devices 104 are part of a group that includes the subsequently selected device 104. This process continues, ad seriatim, until all devices 104 of a substrate 100 are identified as being part of a group, even if the group in question includes only a single device 104.

In one embodiment, grouping is determined on the basis how far alignment of a device deviates from grid established by the reticle 334 used to lithographically expose devices 104 of a substrate 100. This process is facilitated by having alignment data for each device 104 relative to the substrate 100 stored in a data file as described above. Starting with an initially selected device, the coordinate system of the reticle 334 is aligned with the initially selected device. This alignment and the spacing and orientation of patterns on the reticle establish nominal positions for where adjacent devices should be located. The actual alignments of devices 104 adjacent to the initially selected devices are then compared to the nominal positions to determine if they are within an alignment tolerance. Where an adjacent device 104 is indeed within the alignment tolerance, the adjacent device is considered to be part of a group that includes the initially selected device 104. All devices 104 adjacent to the initially selected device are assessed in this manner. Thereafter, devices adjacent to the newly established group are assessed to determine whether they are within the alignment tolerance. This process continues until no adjacent devices are within the alignment tolerance. Thereafter, a device 104 outside of the newly established group is selected and the grouping process continues. As one would imagine, this process continues until all devices 104 of a substrate 100 are part of a group. Alternatively, the grouping process may be terminated where a group exceeds a predetermined size, usually the size of the largest shot that may be exposed by a lithography system.

Criteria for grouping devices 104 may vary. In another embodiment, a small set of devices 104 is selected and the array of patterns of the reticle is matched thereto to establish a grid. While the number of devices 104 initially selected in this embodiment is arbitrary, at least two devices are required. It is desirable to ensure that the initially selected devices 104 can successfully be exposed together using a common alignment of the reticle to the devices 104, however it is to be understood that in some cases, not all devices 104 can be successfully aligned. That being said, where the initially selected devices 104 cannot be aligned together, it is often preferred to select another set of devices to define a group. As above, devices 104 adjacent to the initially selected set of devices 104 will be assessed to determine whether their alignment will fall within an alignment tolerance with respect to the grid established by the reticle. Adjacent devices are added to the newly established group until devices that satisfy the alignment tolerance can no longer be found. Thereafter a subsequent set of devices 104 are selected to define a subsequent group. One benefit to selecting a set of devices to define a group is that this may avoid the problem of defining groups on the basis of highly variable alignments in some devices 104. The use of multiple devices 104 to establish a group smooths over high variability in alignment.

Figure 7:
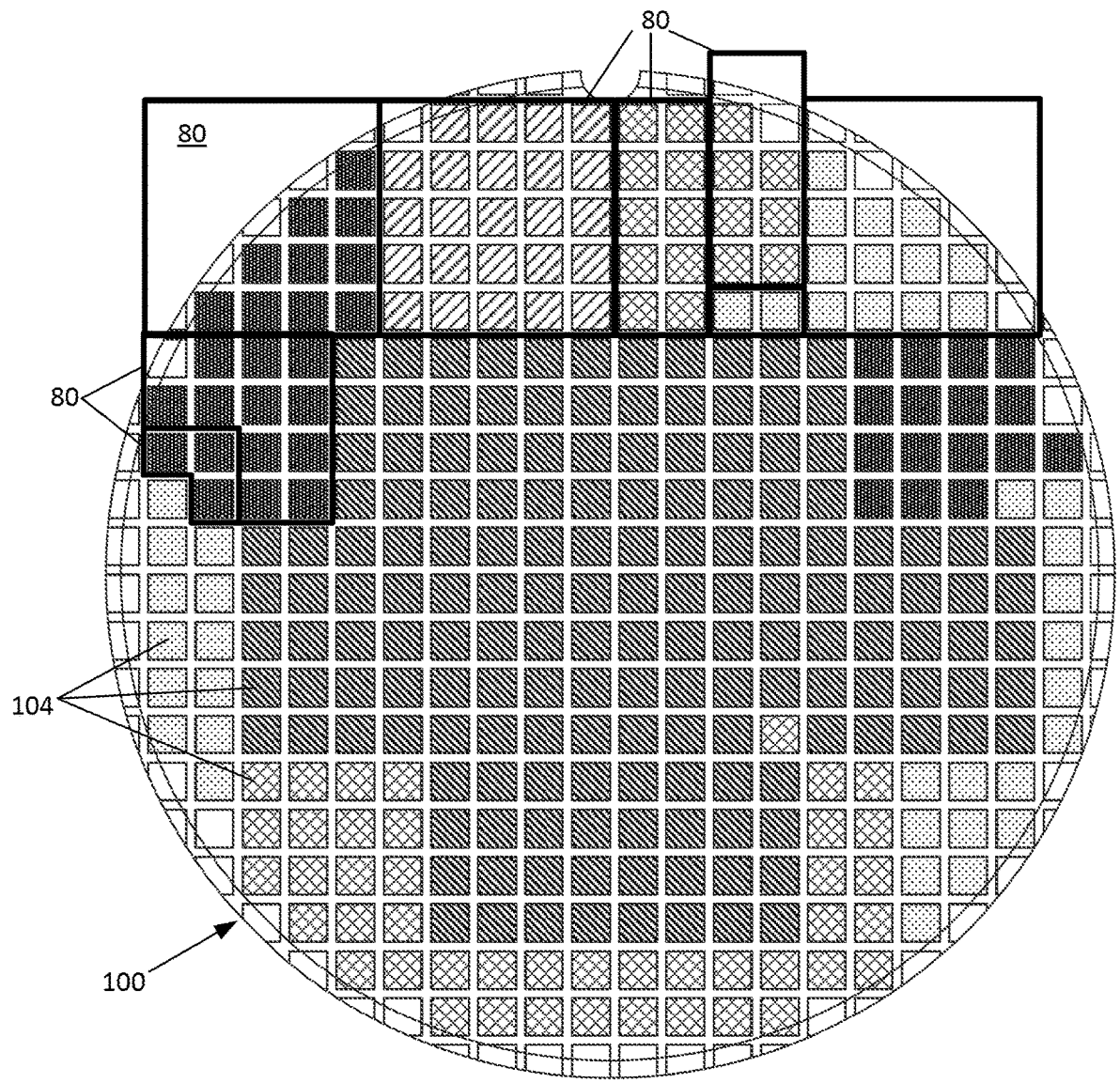
FIG. 7 shows a partial semiconductor substrate exposure tiling.

A simplified representation of what a reconstituted wafer W having devices 104 at different alignments is shown in FIG. 7. The different alignments of devices 104 are denoted by the varying fill patterns of the groups of the devices 104. Note that the groups shown in FIG. 7 are exemplary only and may be much more complex as in the case of poorly aligned reconstituted substrates S with smaller devices 104 or much less complex as where the substrate 100 is formed ab initio with devices 104.

Figure 8:
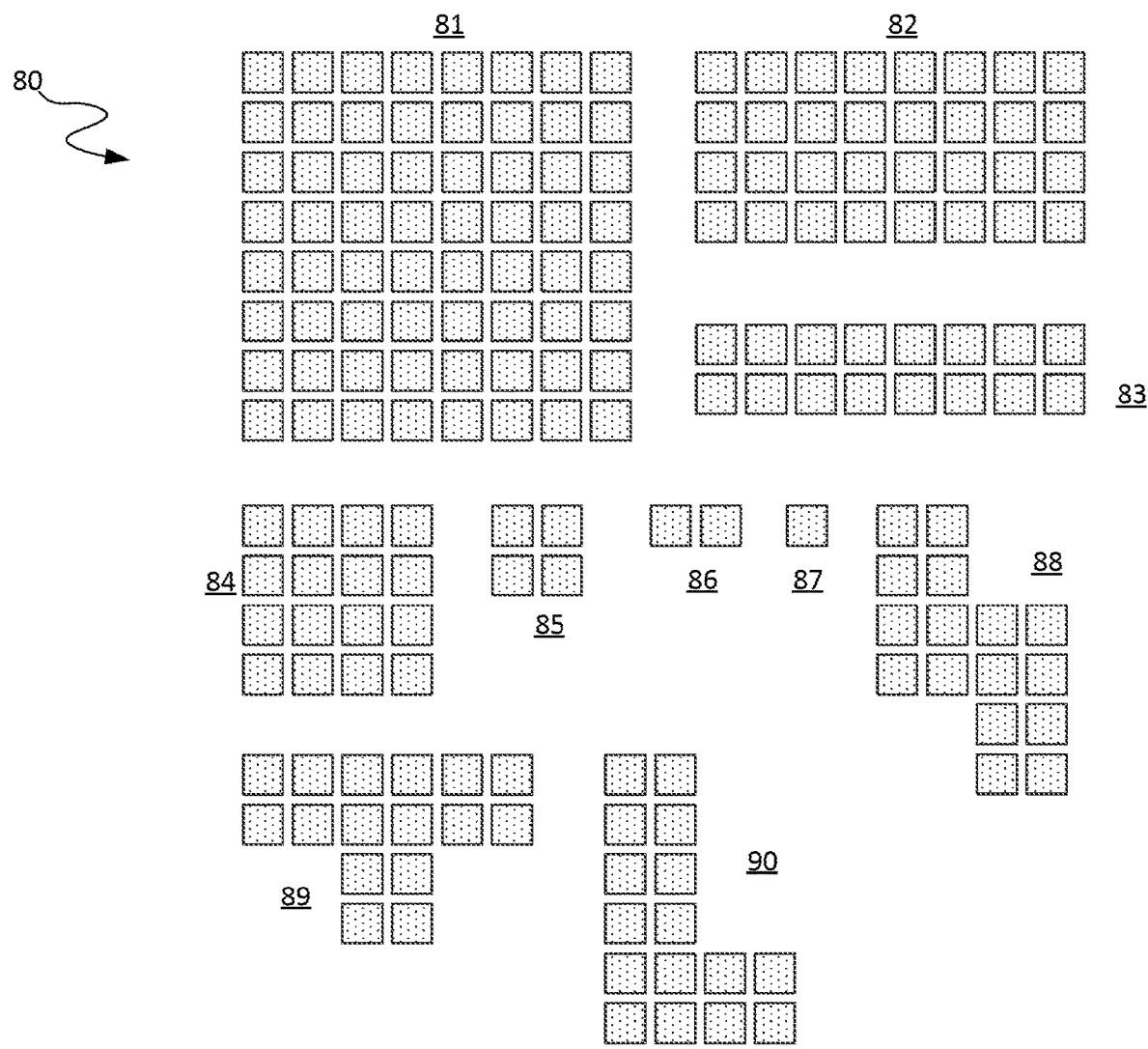
FIG. 8 shows a number of exemplary shot arrays that may be used to expose a substrate.

Once all groups on a substrate 100 are identified, one turns to step 604 wherein exposure fields of view, referred to hereafter as 'shots', are mapped onto the respective groups of devices 104 identified at step 602. FIG. 8 illustrates a number of possible shots 80 that may be projected onto the devices 104 on substrate 100 during exposure. Each shot 80 includes one or more patterns to be projected onto devices 104. The patterns of each shot 80 form arrays that align with a nominal device 104 alignment. Where the alignment of devices 104 is quite good, a large shot array such as array 81 exposes a large number of devices simultaneously. Smaller shots 80 better match the alignment of smaller groups of devices 104. For example, array 87 includes a single pattern used to expose a single device 104.

Shots 80 are preferably regular, rectilinear arrays of patterns. Each of the arrays 81-90 may be wholly formed on a reticle and exposed as is after alignment to the devices 104. The shot arrays may also be formed by reducing the size of larger arrays using masking devices, blades, spatial light modulators or the like (not shown). For example, arrays 82 and 83 may be formed by masking off ½ and ¾, respectively, of array 81. More complex shapes such as arrays 88, 89, and 90 may be formed into the same or a different reticle as the one that includes array 81. The efficient arrangement of arrays on reticles is known to those skilled in the art. Lithography system 300 includes a reticle chuck 332 for alignment, handling, changing, and/or masking one or more reticles 334. Multiple reticles may be used to establish a larger number of shots 80.

Figure 9:
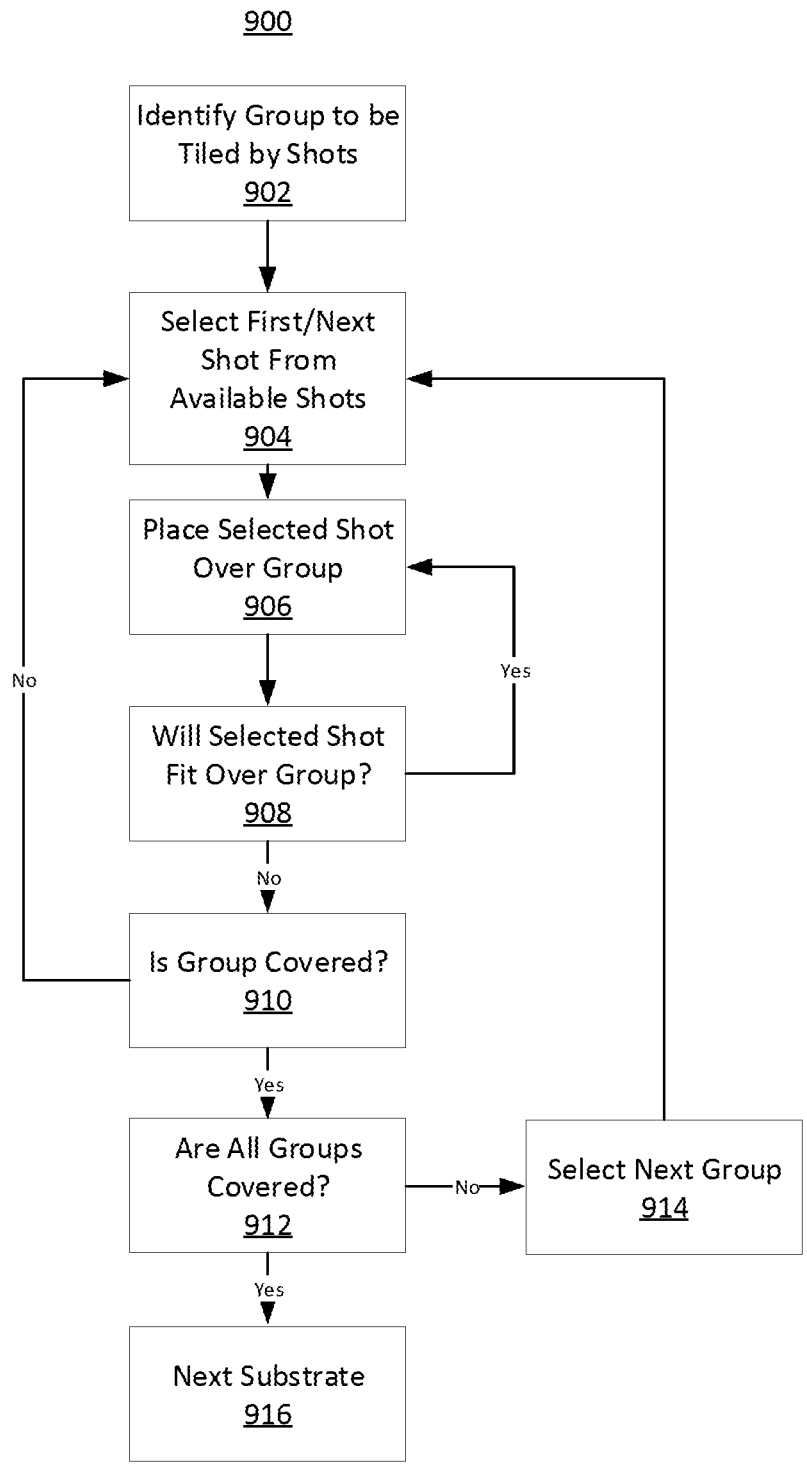
FIG. 9 shows a method of tiling fields of view over a substrate for lithographic processing.

One embodiment of a process for mapping shots 80 onto the devices of a substrate 100 can be modelled as a tiling or 2D packing problem. A more detailed example of one suitable method for carrying out step 604 is identified at numeral 900 in FIG. 9. For the purposes of this application it is to be understood that the term 'tiling' can be used as both a noun and a verb. In its action sense, tiling refers to the process of fitting arrays of images (shots 80) projected by the projection camera 310 onto respective devices 104 such that all or substantially all of the devices 104 are exposed, simultaneously or ad seriatum. This process of tiling is simple where all devices 104 on a substrate 100 share a single alignment. But where the alignment of devices 104 differs, it is necessary to tile the projections from the projection camera 310 onto devices 104 or groups of devices 104 that have matching or at least sufficiently similar alignments. In its proper noun sense, the term 'tiling' refers to the arrangement of differently sized and/or aligned projects or shots over the devices 104 of a substrate 100.

A tiling may be formed manually by a user who selects shots that align well with a selected set or group of devices 104. However, this manual process is slow and a user is unlikely to be able to conduct an optimization of tilings in any reasonable amount of time. Manual tilings, complete or partial, are useful where more automated systems fail to arrive at solution or where practical considerations suggest that an automatically generated tiling should be modified.

Shots 80 are tiled over the groups identified at step 902 by identifying the first group of devices that is to be tiled as at Step 902. A first shot 80 is selected from the set of all available shots (for example shots 81-90) at step 904. The group and the shot selected at steps 902 and 904 may be considered initial conditions for this process. By varying or perturbing these initial conditions, it is possible to modify the outcome of the tiling process itself. Perturbing the initial conditions may involve arbitrarily selecting a shot 80 that is to be applied to an arbitrarily selected group of devices 104. What is more, the groupings identified at step 602 may also be modified as described hereinabove. While the first shot 80 may be arbitrarily selected, it is preferred to sort the shots 80 that are available in a predetermined order. This can be based on any desired characteristic, but a descending sort by size is useful. As the efficiency of an exposure operation is directly proportional to the size of the shot 80, it is desirable to ensure that larger and fewer shots 80 are used to tile the groups identified in step 602. Accordingly, one will preferably start with the largest shot 80 from the set of all available shots.

The tiling process continues at step 906 by attempting to fit the selected shot 80 into the selected group. Determination of whether the shot 80 will fit within the group of devices is made at step 908. This can be done in a number of ways including by modelling the shot 80 and the devices 104 in the group as polyominoes. The polyomino modeled shot 80 can be rotated and/or translated until a shot 80 orientation and size that fits over the remaining devices 104 is identified. This filling or fitting process continues so long as the shot 80 will fit over the group of devices. Where the shot 80 will not fit onto the group of devices 104, step 910 determines whether the group of devices has been fully covered. Where the group is not fully covered by shots 80, the process moves back to step 904. In this circumstance a different shot 80 is selected and the fitting process proceeds to step 906. Note that where the set of available shots 80 has been sorted on size, this next shot 80 will be the next smallest shot 80, though as mentioned above, it is always possible to select an arbitrary one from the available set of shots 80. This process continues until all or substantially all of the devices in a selected group are covered by shots 80. Step 910 considers whether the group has been covered and where this is the case, the process moves to step 912 which considers whether all of the groups identified in step 902 have been covered. Where groups remain uncovered, step 914 moves the process onto the next group of devices. Where all groups have been covered, process 900 moves on to a subsequent substrate, if any, at step 916. More formalized tiling algorithms may also be used to generate tilings of the groups of devices 104.

A score can be computed for the tiling of shots 80 over the groups of devices on substrate 100. This score may be used for determining whether a threshold value for the tiling has been achieved or may be used for optimization by comparing successive iterations of the result of process 900. One score that may be used would be to merely count the number of shots 80 that are used to cover the devices of substrate 100. As will be understood, larger shots 80 tend to be more efficient and so fewer shots 80 in a tiling will be considered to be a more efficient tiling. Another score may involve taking into consideration a cost associated with each shot 80 used to cover the devices of substrate 100. For example, a weight may be assigned to each shot array size so that more inefficient tilings will be scored higher than more efficient ones. In this example a multiplier that is inversely proportional to size may be applied to the count of each shot array size. The score is accordingly increased faster by smaller shot array sizes than by larger shot array sizes. Other costs may be applied in a similar fashion. For example, it is arguably simpler to use shots 80 that have a regular rectangular shape. More complex shot array shapes such as shots 88, 89, and 90 in FIG. 8 may require complex masking operations or even an additional reticle that must be changed. In this instance, while the use of such complex shapes may assure more accurate alignment of shots in some situations, the use of these more complex shapes may be disfavored due to the added time required to employ these shot array shapes. A score might then be: score=Σ(cost× count of each shot array size). This score can be compared to a threshold value as where any tiling having a score below a predetermined, set threshold value is immediately acceptable. Alternatively, this score can be recorded and used for optimization purposes.

In one embodiment, a score equal to the total number of shots 80 required to expose an entire substrate 100 is established. Thereafter, the grouping process described above is re-run starting with different initially selected groups of device(s) 104. Shots 80 are fit to the subsequent groups and a new score is recorded. This process continues for a predetermined number of iterations or until some threshold score is achieved. In this embodiment, the lowest score (fewest shots) identifies an optimal solution. In another embodiment, a score based on the total number of shots and the complexity of each shot is generated. This type of score could involve summing the total number of line segments required to bound each shot 80. Given that regular arrays having square and rectangular shapes are easier to expose, fewer boundary line segments may indicate a simpler and more efficient solution. In yet another embodiment, a score for each tiling of shots 80 may be formed of a composite of the number of shots, the number of devices in each shot, and the number of line segments required to bound each shot. The idea here being that fewer and larger shots with simpler, more regular shapes are preferable to shots that are more numerous, with fewer devices per exposure and more complex masking requirements.

In one embodiment, the optimization of tiling shots 80 onto the devices 104 of a substrate 100 can be characterized as a branch and bound optimization problem. In this instance process 900 is conducted a number of times, in each instance some variation in the starting conditions or how shots are selected may be used to generate alternative tiling solutions for a given substrate 100. Each of the alternative tiling solutions are scored and compared. This type of optimization may be undertaken for any given group of devices or for any desired shot array size or configuration. Optimization continues until an arbitrary limit on the time or number of iterations has been reached, whereupon the best solution is selected. Alternatively, optimization continues until some predetermined threshold is met. Such a threshold may be based on an objectively determined score or may be based heuristically on the experience of the user of the system 300. Yet another optimization limit may be the identification of a minima value (local or global).

The next step in process 600 is to determine a path for exposing devices 104 on substrate 100 using the tiling determined at step 604. This path finding step 606 may be characterized as a traveling salesman type problem, though preferably some simplifications will be used to reduce the computational overhead that can be involved in identifying an optimal path. One approach to determining a path for the exposure of the substrate is to use the greedy heuristic. The greedy heuristic involves always selecting as the next path segment the segment that has the lowest cost. As with the optimization of the tiling of shots 80 onto the substrate 100, the cost may include an objective distance measurement as well as a time factor related to overhead incurred by the modification of alignment, changing reticles, or masking the shot arrays on the reticle. This process continues until a recipe in which all shots 80 will have been visited and exposed is generated.

Optimization of the path used for exposure may again be conducted using a branch and bound approach. Note that other optimization techniques may be used as well. In implementing a branch and bound approach, the greedy heuristic will be interrupted to cause a less optimal choice to be made at some point along the developing path. In perturbing the greedy heuristic, different local minima/maxima paths may be identified. This may be implemented by simply starting from a number of different initial shots 80. Alternatively, at any point during the development of a path using the greedy heuristic, a more costly path segment may be selected, the greedy heuristic being used again after the perturbation. In each case a score is determine for comparison and optimization purposes as described above. Regarding paths, the key characteristic to be minimized is time. In this instance, a score may take the form of a summary of the travel time from one shot 80 to another, together with an accounting of additional time that may be incurred, such as time needed to mask or change a reticle or modify an alignment of a shot 80 to match the devices 104. The scores for paths generated using a branch and bound type optimization approach are compared and an optimal value is selected. As discussed above, the first path that satisfies a predetermined time threshold, the best scored path obtained within a set time or computation limit, or a local or global minima or maxima may be selected as the optimal path.

By way of further example, the establishment of a recipe for exposing a semiconductor substrate 100 is an iterative process. The tiling process, whereby groups of similarly aligned devices 104 are identified may be conducted a large number of times, each iteration resulting in a different grouping of devices 104. Tilings may be performed for each of the different groupings so that each grouping of similarly aligned devices has a shot 80 fit thereto. Again, multiple tilings may be generated for each of the respective groupings. Further, multiple paths may be generated for each of the multiple tilings. In order to identify an optimal recipe, scores are generated for the tilings and the paths. These scores may also be generated as composites of the respective scores for the tilings and paths. As one may appreciate, this process can be costly in terms of computing power. As a result, it is often desirable to arbitrarily limit the number of iterations numerically (e.g. no more than ~500 iterations) or chronologically (e.g. no more than ~5 minutes of computation). One may also set a threshold for the scores that, once met by a prospective recipe, will termination the establishment process.

The above identified steps 604 and 606 may each be optimized separately. It is also possible to optimize these steps together, particularly where these steps are conducted in succession. For example, a path may be determined for a newly generated tiled arrangement of shots 80 whereafter a second tiled arrangement of shots 80 is determined along with an associated path. Because the number of shots 80 in a given tiling is directly related to the time required to follow a path that visits each of these shots, the path score can be used to identify a suitable tiling/path for use in a lithography recipe. And, as suggested above, yield and throughput may also be used to generate a revenue based score.

Figure 10:
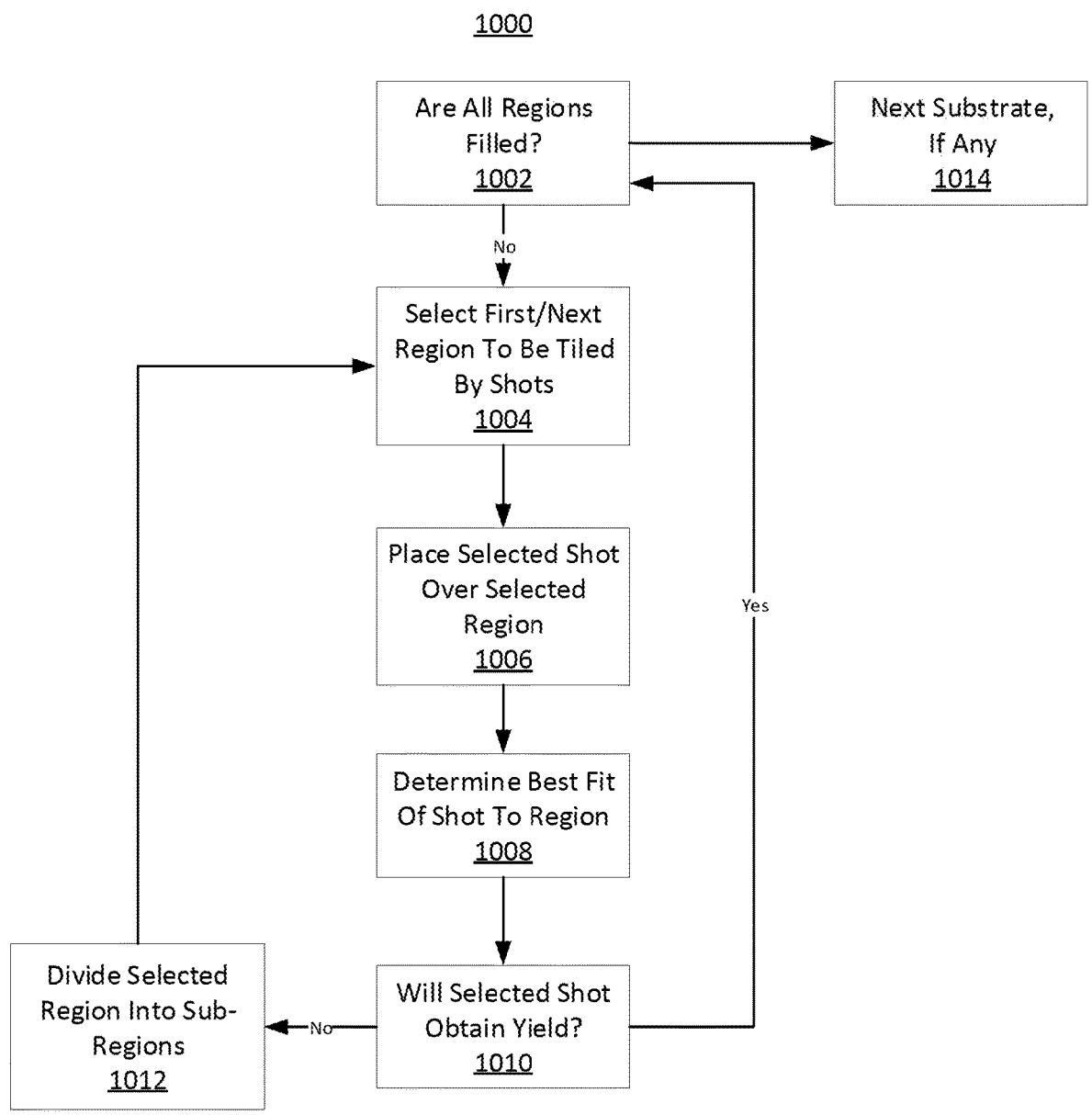
FIG. 10 shows a method for generating a recipe for lithographic processing.
Figure 11A:
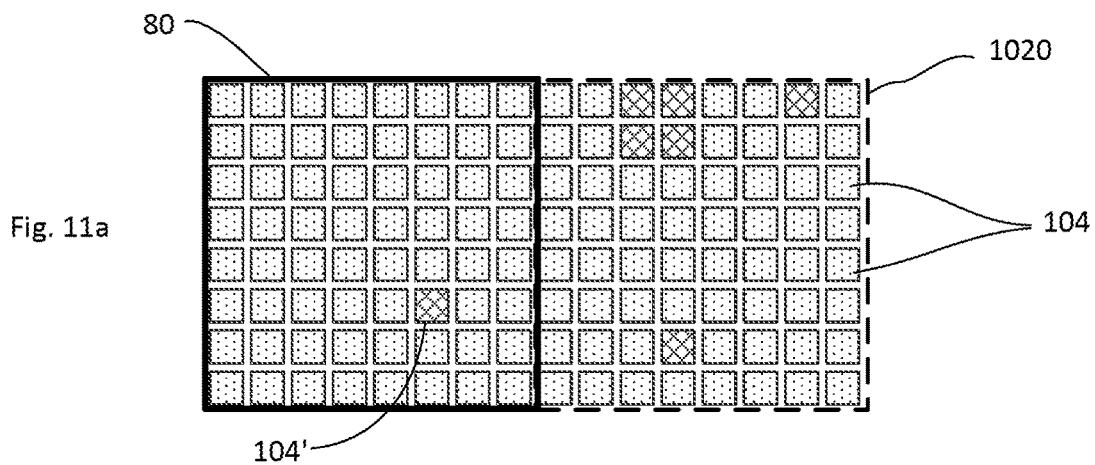
FIGS. 11a-11d show the application of a shot to a region of a substrate.
Figure 11B:
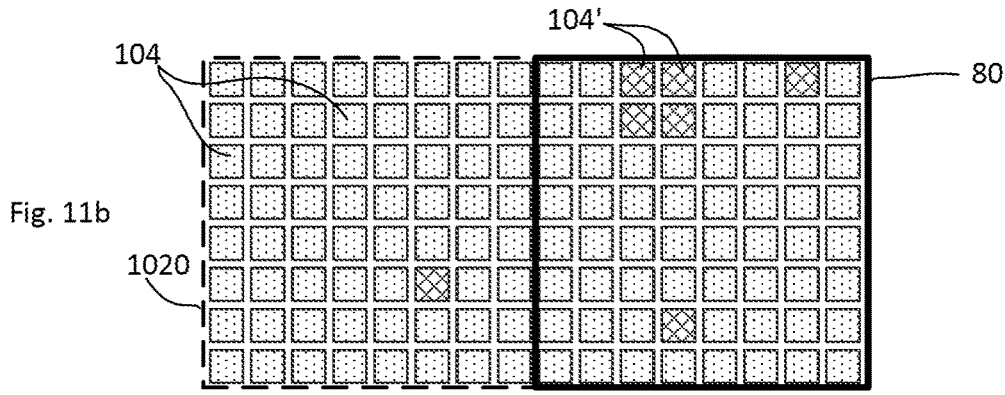

Another method for generating a recipe for lithographic processing is illustrated in FIGS. 10 and 11. The general method 1000 of this approach is shown in FIG. 10. This method omits the concept of grouping devices by alignment described above and instead proceeds directly to tiling shots 80 onto the devices 104 of a substrate 100. As used in this methodology, the term 'region' applies to an area that is to be covered by a shot 80. Regions are generally the same size as a shot 80 that is being aligned thereover, but since a region may be subdivided, the term should not be taken as being identical to the term shot or field of view. The method 1000 starts with a preliminary step 1002 in which it is determined whether the region has been tiled as yet. One will appreciate that this step is a logical step used to ensure that the tiling process ends when completed. Where regions remain to be tiled, the first, or perhaps next, region is selected at step 1004. A shot is then selected that has a largest area that may be applied to the selected region for best throughput. The selected shot is then figuratively placed over the region at step 1006 and the best fit of the selected shot to its region is determined at step 1008. Based on the determined best fit, a projected yield for the combination of the region, shot and fit is computed at step 1010. The projected yield is an assessment of whether the patterns that make up a shot are sufficiently well aligned to reasonably output an IC device of acceptable quality. In one embodiment, this projected yield assessment is done on a device by device basis over the entire shot and the percentage of the total number of devices 104 that satisfy predetermined alignment criteria or requirements are tallied. Using this tally, one determines a cumulative projected yield for a shot and where this projected yield is acceptable, the region is considered to have been successfully tiled/aligned and the shot is recorded for use as part of an exposure recipe. Once a successful shot is identified, the shot is established as part of the recipe and the process will move back to step 1002 to determine if all regions of a substrate 100 have been tiled. Where all regions have been tiled, the process would proceed to the next substrate, if any, at step 1014. FIGS. 11*a* and 11*b* illustrate the application of a shot 80 to a region 1020 wherein alignment/yield is acceptable. Within the shot 80 in FIG. 11*a*, alignment for only a single device 104' is considered to be out of specification, and accordingly, the yield is relatively high at approximately 98%. As a result, the region 1020 to which the shot 80 was applied in FIG. 11*a* is considered to have been successfully tiled and the process has moved to a subsequent region 1020 as seen in FIG. 11*b*.

Where a given combination of region, shot, and alignment does not meet predetermined yield requirements, the process 1000 will proceed from step 1010 to step 1012 in which the selected region is divided into one or more sub-regions. As seen in FIG. 11*b*, a relatively larger number of devices 104' are not within alignment specifications. In this example, the yield would be approximately 90%. Assuming that this yield value is not acceptable (for example, where a yield threshold has been predetermined to be approximately 92%), region 1020 will be divided into ever smaller sub-regions until the yield threshold is satisfied. This is accomplished by iterating steps 1004 to 1012 until a desired yield value is obtained.

Figure 11C:
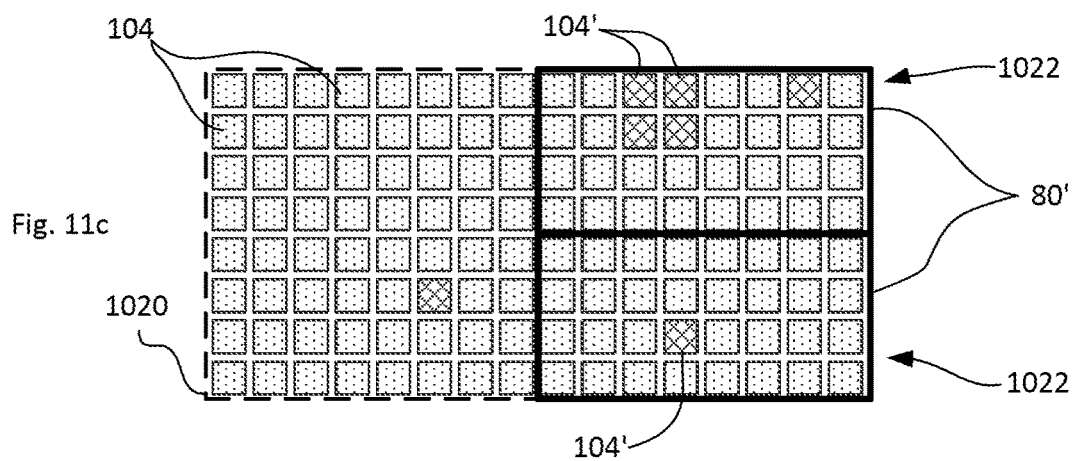

Step 1012 involves the division of a shot 80 into one or more small shots 80' that cover the region 1020. As mentioned above, it is desirable to start process 1000 using the largest shots that may be applied to the region 1020. This is due to the relative efficiency of using a larger shot. In FIG. 11*c* the first selected shot is replaced with two smaller shots 80'. Note that any of the shots 81-90 shown in FIG. 8, or the like, may be used as part of process 1000.

Figure 11D:
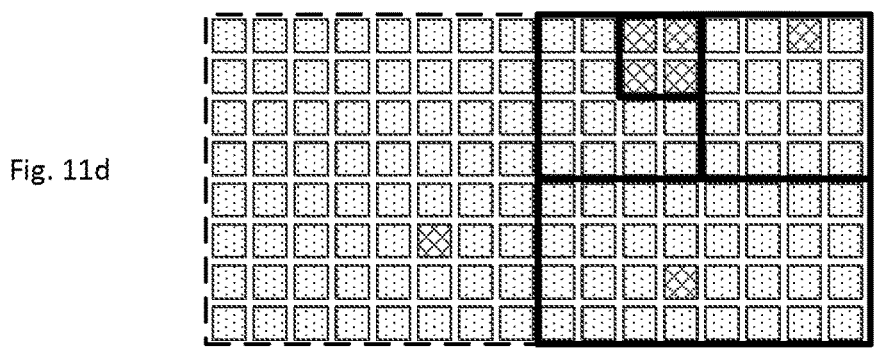

As seen in FIG. 11*c*, the upper shot 80' covering the sub-region 1022 has a yield of approximately 84%, which is below the exemplary threshold of 95%. Lower shot 80', covering another of the sub-regions 1022, has a yield of approximately 97%. As a result, the lower sub-region 1022 will be accepted as having been successfully tiled whereas the upper sub-region 1022 will be further subdivided at step 1012. This process continues as shown in FIG. 11*d* wherein all regions and sub-regions have been tiled with selected shots such that each shot has a yield, based on alignment, of more than the predetermined yield threshold.

In one embodiment, a heuristic may be applied to further increase the throughput of the system 300. For example, the upper right-most subregion 80' in FIG. 11*d* includes a 4×4 array of devices 104, one of which cannot be well aligned with the remainder of the devices when addressed by a 4×4 shot. Were the yield threshold set to 95%, this sub-region would be again sub-divided until there was agreement between the region/sub-region, shot, their alignment, and the yield threshold. This could result in multiple extra shots, thereby reducing throughput. A separate logical loop may be applied to the process of FIG. 10 to assess whether one or more devices 104' can be written off in the interests of increasing the throughput of the system 300. For example, given a yield threshold for a substrate 100 of 95%, so long as the total yield of the substrate 100 is maintained, otherwise good devices 104' that are hard to accord with their surrounding devices 104 might be discarded to reduce the number of shots required to fully expose the substrate 100. This would increase the throughput of the system 300 whilst maintaining the yield requirements. Note that this type of heuristic may be applied on an ongoing basis each time a region is subdivided into sub-regions (ceasing when the yield threshold was passed) or globally after the entire substrate has been tiled with shots 80. Other such heuristics may also be applied to modify the yield or the throughput or some combination of the two. This type of heuristic may incorporate relative value of various devices 104 based on some quality metric/desired end use or even where more than one type of IC device 104 is included on the substrate 100.

Those skilled in the art will appreciate that solving a difficult problem such as tiling fields of view or exposure shots over groups of devices from first principles each time the problem is proposed is resource intensive. One way to eventually reduce the computational work load is to retain solutions to the field of view tiling solutions as they are generated for each substrate. This technique, referred to as dynamic programming, allows one to use previously generated solutions as opposed to computing new solutions each time. Assuming that the systematic error in the alignment of devices on a substrate is similar from substrate to substrate in a lot of substrates, a tiling solution for arranging fields of view over the devices of a first substrate should provide at least partial solutions for the tiling of fields of view over the devices of subsequent substrates. Random error in the alignment of devices on successive substrates can be accommodated by generating alignment solutions for an optimal field of view or fields of view in those regions where pre-existing solutions to the alignment problem do not meet established criteria.

In practice, one embodiment of invention may involve using a preexisting alignment recipe as a starting point. In this approach, each preexisting field of view size, shape, and orientation may be tested against the alignment information of the devices on the substrate under analysis. Where a preexisting field of view does not satisfy predetermined alignment criteria for the devices of the substrate under analysis, those devices are set aside and the process proceeds to the next preexisting field of view. This process continues as described until all preexisting fields of view have been tested with respect to the devices of the substrate under analysis. Where all assessed fields of view satisfied the predetermined criteria, the preexisting recipe, which includes field of view size, shape, and alignment information, can be used for the exposure of the substrate under assessment. Where devices have been set aside, alignment algorithms as described above are used to determine acceptable alignments and fields of view for the remaining devices. The process continues until all devices 104 are tiled with a properly aligned field of view. Note that in some instances, as suggested above, one or more devices may be omitted entirely from the exposure process so long as doing so for the entire substrate satisfies predetermined criteria for alignment and for yield.

In addition to using a preexisting alignment recipe of a first substrate to arrange or perhaps pre-solve some alignment issues for successive substrates, one may use an established library of alignment and field of view arrangement solutions. While it is likely that only substantially similar substrates, e.g. substrates from similar or identical lots or product families which have the same size, pitch, and device dimensions, may prove useful for determining alignment in a dynamic processing, alignments of even disparate substrates may be provide alignment solutions for some or even all devices on a substrate.

FIG. 12 illustrates a cloud communication arrangement for carrying out the present invention in accordance with one embodiment. In use, data flows to and from system (or tools or mechanisms) 1200 for forming substrates, system 1204 for conducting inspection and determining alignments of devices on substrates, and system 1202 for performing lithography on the substrates. While direct connections between systems 1200, 1202, and 1204 are possible, it is preferable to utilize standard networking or cloud communication systems 1206 to facilitate communication. Further, by using a cloud arrangement such as that illustrated, the systems 1200, 1202, and 1204 may be geographically remote from one another. Given that substrates 100 may be transferred geographically for processing at different facilities, systems 1200, 1202, and 1204 may perform functions in a temporally spaced apart fashion as well. As mentioned elsewhere in this application, data may be recorded in any useful format, though XML is often preferred.

Systems, apparatuses, and methods described herein may be implemented using digital circuitry, or using one or more computers using well-known computer processors, memory units, storage devices, computer software, and other components. Typically, a computer includes a processor for executing instructions and one or more memories for storing instructions and data. A computer may also include, or be coupled to, one or more mass storage devices, such as one or more magnetic disks, internal hard disks and removable disks, magneto-optical disks, optical disks, etc.

It will be appreciated that the tools and apparatuses used in the formation of IC devices on substrates at most all points in their processing are largely computer controlled. And, while these apparatuses may each function independent of one another, it is generally the case that these apparatuses are connected by means of various types of networks. In this way, their operation can be remotely controlled and monitored. Manual input of data and instructions to these apparatuses, while possible, is deprecated in favor of the use of automated recipe creation methods and even the repurposing of pre-existing recipes from similar, pre-existing substrates or products. In a more preferred embodiment each apparatus involved in the measurement of alignment of devices 104 on a substrate 100, in the placement of devices 104 into a molding for the formation of composite substrates, or the exposure of devices 104 as part of the lithography process has a computer associated therewith that handles the operation of the apparatus itself and which also handles communications/data transfer with other computers, servers, networks, database, storage media, or cloud based computing systems over standard or to be implemented communications systems. Remote computers or systems may coordinate the operation of the aforementioned apparatuses to produce efficiently integrated circuit devices 104. In one embodiment, a server connected to network maintains a repository of recipes, which, as mentioned above, are sets of instructions for operating the apparatuses individually or in conjunction with one another. A recipe may be represented electronically in any useful format, however it has been found that XML and various TXT file formats are useful.

In addition to recipes, which are typically used to instruct apparatuses in the processing of multiple substrates 100, the various computers associated with the apparatuses in a local or distributed manner may create, modify and retain results files that relate data about individual substrates 100. These results files may constitute centralized databases or individual computer files. In either case, as substrates 100 are processed, the database or individual computer files are updated. These databases or computer files may include data such as textual, numerical, and/or image data concerning each substrate 100. The data may relate to the substrate 100 as a whole, to individual devices 104 or groups of devices 104, to individual processes that were carried out with respect to the substrate, device, or groups of devices. At the users' discretion, a result files may include a complete record of everything that has been done relative to a device 104 from creation to completion. As always, other variations on this concept may be used. Of import is the fact that results files may be used to record the alignment of individual devices 104 of a substrate 100. These alignments may be used by various computers that are part of or connected to a system to carry out any of the foregoing methods or processes. These results files may be used iteratively to record the progress of a substrate 100 and its devices 104 as they are repeatedly processed by apparatuses.

Computers that form part of or which are connected to the system may include both general and special purpose microprocessors or central processing units (CPUs), which may be used singly or in combination with one another in any suitable linear or parallel arrangement. Data storage devices such as random access memory (RAM), read-only memory (ROM), disk drives, solid state drives, and the like of various types and quantity are connected and used in the normal course as understood by those skilled in the art. Input/output devices such as a keyboard, mouse, tablet, printer, scanner, display screen, etc. are similarly included and used in their well understood capacities.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

What is claimed is:

1. A method to reduce misalignment errors in exposing devices in a substrate comprising:
    inspecting the substrate having a plurality of devices to identify each device's X, Y, and Θ orientation;
    determining, from the inspecting, a first group of devices that can be exposed together;
    exposing the first group of devices based on the determining step;
    adjusting the substrate using a stage to align a second group of devices with a different alignment to account for an alignment error of the second group of devices; and
    exposing the second group of devices after the adjusting.

2. The method of claim 1, further comprising generating a recipe for exposing the plurality of devices based on the determining step, the recipe including information on a plurality of exposure shots, an order for exposing the exposure shots, and a path for moving between the plurality of exposure shots.

3. The method of claim 1, wherein the inspecting is performed on an inspection system that sends a data file to a lithography system over a network.

4. The method of claim 1, wherein the second group of devices is a different number of devices from the first group of devices based on criteria that selected a different combination of devices.

5. The method of claim 4, wherein the second group of devices has a different shape than the first group of devices based on criteria that selected a different combination of devices.

6. The method of claim 1, wherein the first group of devices is determined based on an initial condition that is received.

7. The method of claim 1, wherein the adjusting of the stage involves movements in an X-axis direction, a Y-axis direction, and a rotation motion Θ.

8. The method of claim 1, further comprising:
    generating a recipe using an alignment of the first group of devices and an initial condition to determine the first group of devices and the second group of devices; and
    exposing the first group of devices and the second group of devices based on the recipe and moving from the first group of devices to the second group of devices based on the recipe.

9. The method of claim 1, further comprising:
    selecting an exposure shot having a largest area that can be applied to a region of the substrate having the first group of devices;
    fitting the selected exposure shot to the first group of devices;
    computing a projected yield for the selected exposure shot, the region, and the fitting based on an alignment of the first group of devices; and
    determining whether the projected yield satisfies an alignment criterion.

10. An apparatus that reduces misalignment errors in exposing integrated circuit devices comprising:
    means for inspecting a substrate having a plurality of devices to identify each device's X, Y, and Θ orientation;
    means for determining, from the inspecting, a first group of devices that can be exposed together;
    means for exposing the first group of devices;
    means for adjusting the substrate using a stage to align a second group of devices with a different alignment to account for an alignment error of the second group of devices; and
    means for exposing the second group of devices.

11. The apparatus of claim 10, wherein the means for inspecting is performed on an inspection system that sends a data file to a lithography system, over a network.

12. The apparatus of claim 10, wherein the second group of devices is a different number of devices from the first group of devices based on criteria that selected a different combination of devices.

13. The apparatus of claim 12, wherein the second group of devices has a different shape than the first group of devices based on criteria that selected a different combination of devices.

14. The apparatus of claim 10, wherein the first group of devices is determined based on an initial condition that is received.

15. The apparatus of claim 10, wherein the stage involves movements in an X-axis direction, a Y-axis direction, and a rotation motion Θ.

16. An apparatus that reduces misalignment errors in exposing integrated circuit devices comprising:

an inspection system configured to inspect a substrate having a plurality of devices to identify each device's X, Y, and Θ orientation;
a lithography system configured to:
receive a first group of devices that can be exposed together;
expose the first group of devices;
adjust the substrate using a stage to align a second group of devices with a different alignment to account for an alignment error of the second group of devices; and
expose the second group of devices.

17. The apparatus of claim 16, wherein the second group of devices is a different number of devices from the first group of devices based on criteria that selected a different combination of devices.

18. The apparatus of claim 16, wherein the stage involves movements in an X-axis direction, a Y-axis direction, and a rotation motion Θ.

19. The apparatus of claim 16, wherein the first group of devices is determined based on an initial condition that is received.

20. The apparatus of claim 16, further comprising a computer system that is configured to take data from the inspection system and generate a recipe that determines the first group of devices that are exposed and a path from the first group of devices to the second group of devices.

21. The method of claim 1, further comprising sending correction factors to remove systematic errors in placement of a second plurality of devices by a pick and place system.

22. The method of claim 1, further comprising determining an alignment of the first group of devices based on each device's X, Y, and Θ orientation.

23. The method of claim 22, wherein the stage rotates by Θ after the first group of devices to account for the alignment error in the second group of devices.

24. The method of claim 1, wherein determining the first group of devices involves choosing between different combinations based on at least one of throughput and yield.

25. The apparatus of claim 10, further comprising:
means for sending correction factors to remove systematic errors in placement of a second plurality of devices by a pick and place system.

26. The apparatus of claim 10, further comprising means for determining an alignment of a first group of devices is based on each device's X, Y, and O orientation.

27. The apparatus of claim 26, wherein the means for adjusting the substrate rotates the stage by O after the first group of devices to account for the alignment error in the second group of devices.

28. The apparatus of claim 10, wherein determining the first group of devices involves choosing between different combinations based on at least one of throughput and yield.

29. The apparatus of claim 16, wherein the apparatus is further configured to:
send correction factors to remove systematic errors in placement of a second plurality of devices by a pick and place system.

30. The apparatus of claim 16, wherein the lithography system is further configured to receive an alignment of the first group of devices based on each device's X, Y, and O orientation.

31. The apparatus of claim 30, wherein the stage rotates by O after the first group of devices to account for the alignment error in the second group of devices.

32. The apparatus of claim 16, wherein the first group of devices is identified by choosing between different combinations based on at least one of throughput and yield.

33. The apparatus of claim 10, further comprising:
means for generating a recipe using an alignment of the first group of devices and an initial condition to determine the first group of devices and the second group of devices; and
means exposing the first group of devices and the second group of devices based on the recipe and moving from the first group of devices to the second group of devices based on the recipe.

34. The apparatus of claim 10, further comprising:
means for selecting an exposure shot having a largest area that can be applied to a region of the substrate having the first group of devices;
means for fitting the selected exposure shot to the first group of devices;
means for computing a projected yield for the selected exposure shot, the region, and the fitting based on an alignment of the first group of devices; and
means for determining whether the projected yield satisfies an alignment criterion.

35. The apparatus of claim 16, further comprising a computer system that generates a recipe using an alignment of the first group of devices and an initial condition to determine the first group of devices and the second group of devices, and wherein the lithography system exposes the first group of devices and the second group of devices based on the recipe and moving from the first group of devices to the second group of devices based on the recipe.

36. The apparatus of claim 16, further comprising a computer system that selects an exposure shot having a largest area that can be applied to a region of the substrate having the first group of devices, that fits the selected exposure shot to the first group of devices, that computes a projected yield for the selected exposure shot, the region, and fitting based on an alignment of the first group of devices, and that determines whether the projected yield satisfies an alignment criterion.

* * * * *